United States Patent
Bristol et al.

(10) Patent No.: US 10,109,583 B2
(45) Date of Patent: Oct. 23, 2018

(54) METHOD FOR CREATING ALTERNATE HARDMASK CAP INTERCONNECT STRUCTURE WITH INCREASED OVERLAY MARGIN

(71) Applicant: INTEL CORPORATION, Santa Clara, CA (US)

(72) Inventors: Robert L. Bristol, Portland, OR (US); Manish Chandhok, Beaverton, OR (US); Jasmeet S. Chawla, Hillsboro, OR (US); Florian Gstrein, Portland, OR (US); Eungnak Han, Portland, OR (US); Rami Hourani, Portland, OR (US); Kevin Lin, Beaverton, OR (US); Richard E. Schenker, Portland, OR (US); Todd R. Younkin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/529,483

(22) PCT Filed: Dec. 24, 2014

(86) PCT No.: PCT/US2014/072393
§ 371 (c)(1),
(2) Date: May 24, 2017

(87) PCT Pub. No.: WO2016/105423
PCT Pub. Date: Jun. 30, 2016

(65) Prior Publication Data
US 2017/0263551 A1    Sep. 14, 2017

(51) Int. Cl.
*H01L 23/528* (2006.01)
*H01L 21/768* (2006.01)
*H01L 23/532* (2006.01)

(52) U.S. Cl.
CPC ...... *H01L 23/528* (2013.01); *H01L 21/76816* (2013.01); *H01L 21/76832* (2013.01);
(Continued)

(58) Field of Classification Search
CPC ............. H01L 23/528; H01L 21/76832; H01L 21/76816; H01L 21/76849;
(Continued)

(56) References Cited

U.S. PATENT DOCUMENTS 9,054,164 B1 *   6/2015   Jezewski .......... H01L 21/76879
2004/0113279 A1   6/2004   Chen et al.
(Continued)

OTHER PUBLICATIONS

International Searching Authority at the Korean Intellectual Property Office, International Search Report and Written Opinion for International Patent Application No. PCT/US2014/072393, dated Aug. 31 2015, 11 pages.
(Continued)

*Primary Examiner* — Alexander Oscar Williams
(74) *Attorney, Agent, or Firm* — Schwabe, Williamson & Wyatt, P.C.

(57) ABSTRACT

Embodiments of the invention include an interconnect structure and methods of forming such structures. In an embodiment, the interconnect structure may include an interlayer dielectric (ILD) with a first hardmask layer over a top surface of the ILD. Certain embodiments include one or more first interconnect lines in the ILD and a first dielectric cap positioned above each of the first interconnect lines. For example a surface of the first dielectric cap may contact a top surface of the first hardmask layer. Embodiments may also include one or more second interconnect lines in the ILD arranged in an alternating pattern with the first inter-connect lines. In an embodiment, a second dielectric cap is formed over a top surface of each of the second interconnect lines.

(Continued)

For example, a surface of the second dielectric cap contacts a top surface of the first hardmask layer.

25 Claims, 15 Drawing Sheets

(52) U.S. Cl.
CPC .. *H01L 21/76849* (2013.01); *H01L 21/76897* (2013.01); *H01L 23/53238* (2013.01); *H01L 23/53252* (2013.01); *H01L 23/53266* (2013.01); *H01L 23/53295* (2013.01)

(58) Field of Classification Search
CPC ......... H01L 21/76897; H01L 23/53238; H01L 23/53252; H01L 23/53266; H01L 23/53295; H01L 23/532; H01L 21/768
USPC ................................................ 257/773, 774
See application file for complete search history.

(56) References Cited

U.S. PATENT DOCUMENTS

| | | |
|---|---|---|
| 2004/0232558 A1 | 11/2004 | Toda |
| 2005/0151224 A1 | 7/2005 | Abe |
| 2009/0053890 A1 | 2/2009 | Bonilla et al. |
| 2009/0200668 A1 | 8/2009 | Yang et al. |
| 2009/0250815 A1 | 10/2009 | Yang et al. |
| 2013/0302989 A1 | 11/2013 | Kenny et al. |
| 2014/0038412 A1 | 2/2014 | Hu et al. |
| 2014/0342551 A1 | 11/2014 | Nam |
| 2016/0049364 A1* | 2/2016 | Edelstein ............ H01L 23/5226 257/774 |
| 2017/0263551 A1* | 9/2017 | Bristol .................. H01L 23/528 |
| 2017/0263553 A1* | 9/2017 | Schenker .......... H01L 21/76883 |
| 2017/0330761 A1* | 11/2017 | Chawla ............. H01L 21/31144 |

OTHER PUBLICATIONS

International Preliminary Report for International Application No. PCT/US2014/072393, dated Jun. 27, 2017, 7 pages.

Extended European Search Report for European Patent Application No. 14909263.7, dated Jul. 23, 2018, 7 pages.

* cited by examiner

METHOD FOR CREATING ALTERNATE HARDMASK CAP INTERCONNECT STRUCTURE WITH INCREASED OVERLAY MARGIN

CROSS-REFERENCE TO RELATED APPLICATION

This patent application is a U.S. National Phase Application under 35 U.S.C. § 371 of International Application No. PCT/US2014/072393, filed Dec. 24, 2014, entitled NOVEL METHOD FOR CREATING ALTERNATE HARDMASK CAP INTERCONNECT STRUCTURE WITH INCREASED OVERLAY MARGIN.

FIELD OF THE INVENTION

Embodiments of the present invention relate generally to the manufacture of semiconductor devices. In particular, embodiments of the present invention relate to interconnect structures for semiconductor devices and methods for manufacturing such devices.

BACKGROUND OF THE INVENTION

Modern integrated circuits use conductive interconnect layers to connect individual devices on a chip and/or to send and/or receive signals external to the device. Common types of interconnect layers include copper and copper alloy interconnect lines coupled to individual devices, including other interconnect lines by interconnect through vias. It is not uncommon for an integrated circuit to have multiple levels of interconnections. For example, two or more interconnect layers may be separated from each other by dielectric materials. The dielectric layers separating interconnect levels are commonly referred to as an interlayer dielectric (ILD).

As these interconnect layers are manufactured with interconnect lines having smaller pitches in order to accommodate the need for smaller chips, it becomes increasingly difficult to properly align the vias with the desired interconnect layer. In particular, during manufacturing, the location of the via edges with respect to the interconnect layer or line it is to contact may be misaligned due to natural manufacturing variation. A via however, must allow for connection of one interconnect line of one interconnect layer to the desired underlying layer or line without erroneously connecting to a different interconnect layer or line. If the via is misaligned and contacts the wrong metal feature, the chip may short circuit resulting in degraded electrical performance. One solution to address this issue is to reduce the via size, for example, by making the via narrower. However, reducing the via size results in an increase in resistance and reduces the yield during manufacturing.

BRIEF DESCRIPTION OF THE DRAWINGS

FIGS. 5A-4K are cross-sectional illustrations that illustrate a method of forming an interconnect structure with first and second dielectric caps, according to an embodiment.

DETAILED DESCRIPTION OF THE INVENTION

Described herein are systems that include an interconnect structure that allows for contact formation to tightly pitched interconnect lines and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

Figure 1A:
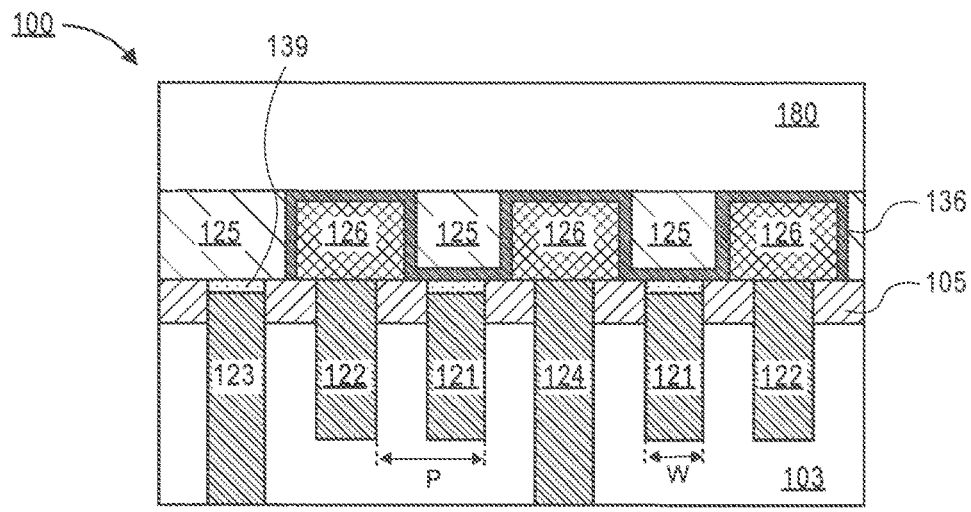
FIG. 1A is a cross-sectional illustration of an interconnect structure that includes first dielectric caps and second dielectric caps formed over a first hardmask layer, according to an embodiment.

FIG. 1A is a cross-sectional illustration of an interconnect structure 100 according to an embodiment of the invention. The interconnect structure 100 may be used in conjunction with any semiconductor device that utilizes one or more interconnect layers, such as an IC circuit or the like. Interconnect structure 100 is formed in an interlayer dielectric (ILD) 103. Embodiments of the invention utilize low-k dielectric materials that are typically known in the art for use as ILDs such as, silicon dioxide. According to embodiments of the invention, low-k dielectric materials suitable for formation of the ILD 103 may also include, but are not limited to, materials such as carbon doped silicon dioxide, porous silicon dioxide, or silicon nitrides. Additional embodiments of the invention may include an ILD 103 formed from dielectric materials with k-values less than 5. Embodiments may also include an ILD with a k-value less than 2. According to additional embodiments, the ILD 103 may include air gaps and have a k-value of 1. According to embodiments of the invention, ILD 103 may be less than 100 nm thick. According to additional embodiments, the ILD 103 may be less than 40 nm thick. An additional embodiment of the invention may further include an ILD 103 with a thickness between 40 nm and 80 nm. Additional embodiments include an ILD 103 that is approximately 60 nm thick.

In an embodiment, a first hardmask layer 105 is formed over the top surface of the ILD 103. By way of example, the first hardmask layer 105 may be a dielectric material, such as a nitride or an oxide. According to an embodiment, the first hardmask layer 105 is resistant to an etching process that may be used to etch through a second interconnect layer 180, such as an additional ILD layer used for forming interconnects, that may be formed above the first hardmask layer 105. Embodiments of the invention include a first hardmask layer 105 that is between 3 nm and 10 nm thick.

According to an embodiment, interconnect structure 100 includes first and second interconnect lines 121, 122 formed into the ILD 103 in an alternating pattern, as shown in FIG. 1A. The first and second interconnect lines 121, 122 are formed with conductive materials. By way of example, and not by way of limitation, the conductive materials used to form the interconnect lines may include, Ag, Au, Co, Cu, Mo, Ni, NiSi, Pt, Ru, TiN, or W. In an embodiment, the same conductive material is used to form the first and second interconnect lines 121, 122. According to an alternative embodiment, the first and second interconnect lines 121, 122 are formed with different conductive materials.

The interconnect lines 121, 122 are spaced apart from each other by a pitch P. Embodiments of the invention include high density interconnect lines with a pitch P less than 60 nm. Further embodiments of the invention include a pitch P that is less than 30 nm. Embodiments of the invention include interconnect line widths W less than 30 nm. Additional embodiments of the invention include interconnect line widths W less than 15 nm. In an embodiment, the first and second interconnect lines 121, 122 have top surfaces that are substantially coplanar with a top surface of the first hardmask layer 105.

According to an embodiment the first interconnect lines 121 may further include a selective cap 139. The selective cap 139 may be a conductive material that is used to differentiate the surfaces of the first interconnect lines 121 from the second interconnect lines 122. The differences in the exposed surfaces is utilized to ensure proper segregation of polymers during a directed self-assembly (DSA) process that it used to form a pattern in which the first dielectric caps 125 and the second dielectric caps 126 are formed. The DSA process is described in greater detail below with respect to FIGS. 2A-2P. In an embodiment, the selective cap 139 formed over the first interconnect lines 121 remains in the final structure as a remnant of the processing operations used to form interconnect structure 100. By way of example, and not by way of limitation, the selective cap 139 may be a metal, such as tungsten (W), an oxide such as hafnium oxide (HfO$_X$), or alloys thereof, such as a tungsten and cobalt alloy. In certain embodiments, the selective cap has a different resistivity than the metal used for the first and/or second interconnect lines 121, 122. For example, when tungsten is used for the selective cap 139, its resistivity is higher than the resistivity of many commonly used interconnect materials, such as copper. Accordingly, it may be advantageous to minimize the thickness of the selective cap. In an embodiment, the thickness of the selective cap 139 may be less than the thickness of the first hardmask layer 105. In a specific embodiment, the thickness of the selective cap 139 may be less than 10 nm. Additional embodiments may include a selective cap 139 that has a thickness less than 5 nm.

According to an embodiment, first dielectric caps 125 may be formed above the first interconnect lines 121 and second dielectric caps 126 may be formed above the second interconnect lines 122. As illustrated, the first and second dielectric caps 125, 126 are formed above the first hardmask layer 105. Accordingly, a deep metal recess of the first and second interconnect lines is not needed in order to form the dielectric caps. Instead of using the trenches in which the first and second interconnect lines 121, 122 are formed to align the dielectric caps, embodiments of the invention rely on a DSA process to form a pattern above the first hardmask layer 105 in which the first and second dielectric caps 125, 126 may be formed. Since the dielectric caps are positioned above the trenches in which the first and second interconnect lines are formed, embodiments of the invention may include first and second dielectric caps 125, 126 that extend laterally beyond the edges of the interconnects. As such, embodiments may include first and second dielectric caps 125, 126 that are in direct contact with a top surface of the first hardmask layer 105.

Embodiments of the invention include first and second dielectric caps 125, 126 made from dielectric materials such as SiO$_X$C$_Y$N$_Z$, SiO$_X$C$_Y$, non-conductive metal oxides and nitrides, such as, but not limited to, TiO, ZrO, TiAlZrO, AlO, or organic materials. According to an embodiment, first dielectric caps 125 and second dielectric caps 126 are made from different materials. For example, the first dielectric caps 125 are made from a material that has a high selectivity over the second dielectric caps 126 during an etching process. As used herein, when a first material is stated as having a high selectivity over a second material, the first material etches at a faster rate than the second material during a given etching process. For example, the first dielectric caps 125 may have an etch selectivity to the second dielectric cap that is approximately 10:1 or greater for a given etching process (i.e., for the given etching process, the first dielectric cap is etched at a rate that is approximately ten times greater than the rate at which the second dielectric cap is etched). According to an additional embodiment, the second dielectric caps 126 are made from a material that has a high selectivity over the first dielectric caps 125. For example, the second dielectric cap 126 may have an etch selectivity to the first dielectric cap 125 that is approximately 10:1 or greater for a given etching process. Additional embodiments of the invention include forming the first and second dielectric caps 125, 126 from materials that have a high selectivity over the first hardmask layer 105 during an etching process. By way of example, the first and second dielectric caps may both have an etch selectivity to the first hardmask layer 105 that is approximately 10:1 or greater for a given etching process.

Embodiments of the invention may also include first and second dielectric caps 126 that are selectively etched with respect to an etchstop liner 136. According to an embodiment, the etchstop liner 136 may be a conformal layer that is deposited over the surface of one or more of the first and second dielectric caps 125, 126, and over the first hardmask layer 105. By way of example, the etchstop liner 136 may have a thickness that is approximately 5 nm or less. Additional embodiments include an etchstop liner 136 that has a thickness that is between approximately 2.0 nm and 3.0 nm. The etchstop liner 136 may be a dielectric material. By way of example, the etchstop liner may be an aluminum oxide or a hafnium oxide. By way of example, the etchstop liner may have an etch selectivity to the first and second dielectric caps that is approximately 10:1 or greater. An additional embodiment of the invention may include an etchstop liner that has an etch selectivity to the first and second dielectric caps that is approximately 20:1 or greater. For example, the first and second dielectric caps may be materials that are susceptible to removal with a dry-etching process, whereas the etchstop liner 136 is a material that is resistant to the dry-etching process, but may be selectively removed with a wet-etching process.

Embodiments that utilize an etchstop liner 136 that has a high etch selectivity with respect to the first and second dielectric caps 125, 126 provides additional benefits. For example, in embodiments where the etchstop liner 136 is formed over the top surfaces 132 of either the first dielectric caps 125 or the second dielectric caps 126, the etch selectivity between the first and second dielectric caps 125, 126 does not need to be as high. The etch selectivity between the first and second dielectric caps 125, 126 may be reduced because the etchstop liner 136 protects one set of dielectric caps from an etching process while the other set of dielectric caps are left exposed.

For example, in FIG. 1A the first dielectric caps 125 are not covered by the etchstop liner 136 and the second dielectric caps 126 are covered by the etchstop liner 136. Accordingly, the first and second dielectric caps 125, 126 may have etch selectivities with respect to each other that are less than approximately 10:1. In some embodiments, the first and second dielectric caps 125, 126 may be the same material and, therefore, have no etch selectivity with respect to each other. While the second dielectric caps 126 are illustrated as being covered in FIG. 1A, it is to be appreciated that the embodiments are not limited to such configurations. Alternative embodiments may also include having the second dielectric caps 126 covered by the etchstop liner 136 and the first dielectric caps 125 not covered by the etchstop liner 136.

According to an embodiment, the interconnect structure 100 may further include one or more first through vias 123 and/or one or more second through vias 124. According to embodiments of the invention, the first and second through vias 123, 124 are integrated into the alternating pattern of the first and second interconnect lines 121, 122. As such, in embodiments of the invention, a first through via 123 is formed where a first interconnect line 121 would otherwise be formed. Similarly, embodiments include forming a second through via 124 where a second interconnect line 122 would otherwise be formed.

First through vias 123 are substantially similar to the first interconnect lines 121, with the exception that the hole in which they are formed extends all the way through the ILD 103. Accordingly, the first through via 123 provides the ability to make an electrical connection through the ILD 103 to a lower level. For example, the electrical connection to the lower level may be made to a conductive line, an S/D contact of a transistor device, or any other feature of a semiconductor device that requires an electrical connection. Likewise, second through vias 124 are substantially similar to the second interconnect lines 122, with the exception that the hole in which they are formed extends all the way through the ILD 103. Similarly, the second through via 124 provides the ability to make an electrical connection through the ILD 103 to the lower level. Illustrations presented in the Figures of the present invention omit the structures of the lower level that may be contacted by the first and second through vias in order to not unnecessarily obscure the present invention. Furthermore, it is to be appreciated that the first and second through vias 123, 124 may not extend along the entire length of the trench in which they are formed (i.e., in a third dimension (into and out of the page) the first and second through vias 123, 124, may only be formed along a portion of the trench, and the remainder of the trench may formed to a depth substantially similar to the first and second interconnect lines 121, 122).

Embodiments of the invention further include first and second dielectric caps 125, 126 formed above trenches that contain the first and second through vias 123, 124 that are substantially similar to those described above with respect to the dielectric caps formed above the first and second interconnect lines 121, 122. In an embodiment, a selective cap 139 may also be formed over the top surface of the first through vias 123 and over the top surface of the conductive material filling the trenches in the third dimension (e.g., first interconnect lines 121), as described above. Providing a selective cap 139 over the first through vias 123 ensures that the DSA patterning process used to form the first and second dielectric caps continues above the through vias as well.

Figure 1B:
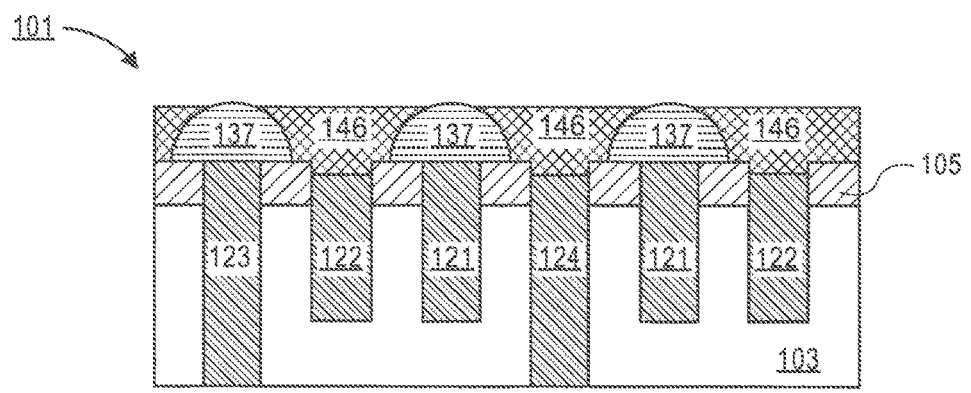
FIG. 1B is a cross-sectional illustration of an interconnect structure that includes first dielectric caps and second dielectric caps formed over a first hardmask layer, according to an additional embodiment.

Referring now to FIG. 1B, an interconnect structure 101 according to an additional embodiment is illustrated. The interconnect structure 101 is substantially similar to the interconnect structure 100 illustrated in FIG. 1A, except for the omission of a selective cap and the shape of the first dielectric caps 137 and the second dielectric caps 146. The omission of the selective cap 139 is possible because the processing used to form the dielectric caps may not rely on a DSA process. Instead, the first dielectric caps 137 may be a metallic oxide that is selectively deposited or grown over only the first interconnect lines 121. By way of example, suitable oxides may include hafnium oxides, zirconium oxides, titanium oxides, aluminum oxides, or the like. Embodiments of the invention include second dielectric caps 146 that are formed with a material that is selectively etched with respect to the first dielectric caps 137.

According to an embodiment, the shape of the first dielectric caps 137 may be dependent on the growth or deposition characteristics of the oxide. As illustrated, the first dielectric caps may form a "rivet head" shape. However, it is to be appreciated that the exact growth pattern of the first dielectric caps 137 are not limited to the pattern illustrated in FIG. 1B. In an embodiment, the first dielectric caps in interconnect structure 101 may be characterized by having sidewalls that are not substantially vertical. In an embodiment, the first dielectric caps 137 may also extend over a top surface of the first hardmask layer 105 proximate to the first interconnect lines and first through vias.

According to an embodiment, the second dielectric caps may also be characterized as having sidewalls that are not substantially vertical. In an embodiment, the second dielectric caps 146 may have sidewalls that are characterized as having a shape that is complementary to the sidewalls of the first dielectric caps. In the illustrated embodiment, the second dielectric caps 146 may have a shape that is substantially an "upside down rivet head". Additional embodiments of the invention may include an interconnect structure 101 that includes second interconnect lines 122 that are recessed below a top surface of the first hardmask layer 105. In such embodiments, the sidewalls of the second dielectric caps may be characterized by a first portion that is substantially vertical and a second portion that is not substantially vertical. The vertical portion of the sidewall is defined by a sidewall of the trench in which the second interconnect lines 122 are formed, and the second portion is defined by the shape of the sidewalls of the first dielectric cap 137.

Figure 1C:
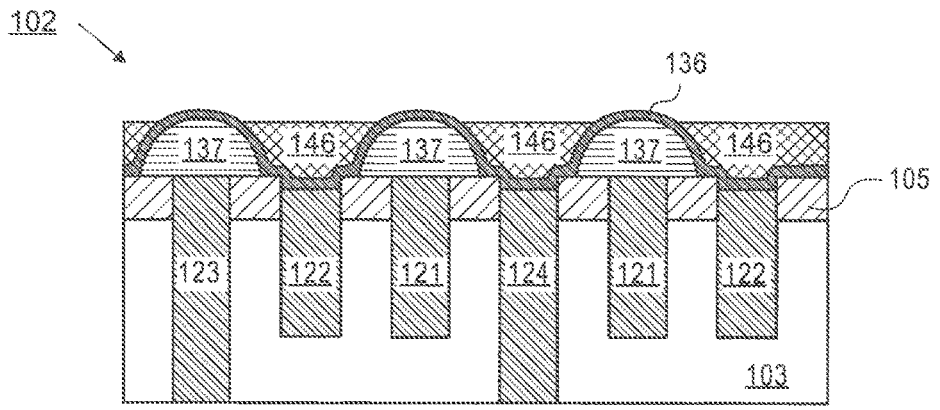
FIG. 1C is a cross-sectional illustration of an interconnect structure that includes first dielectric caps and second dielectric caps formed over a first hardmask layer and an etchstop liner formed between first dielectric caps and second dielectric caps, according to an embodiment.

Referring now to FIG. 1C, an interconnect structure 102 according to an additional embodiment is illustrated. The interconnect structure 102 is substantially similar to the interconnect structure 101 illustrated in FIG. 1B, except for the addition of an etchstop liner 136. According to an embodiment, the etchstop liner 136 illustrated in FIG. 1C may be substantially similar to the etchstop liner described above with respect to FIG. 1A, and therefore will not be repeated here.

Figure 2A:
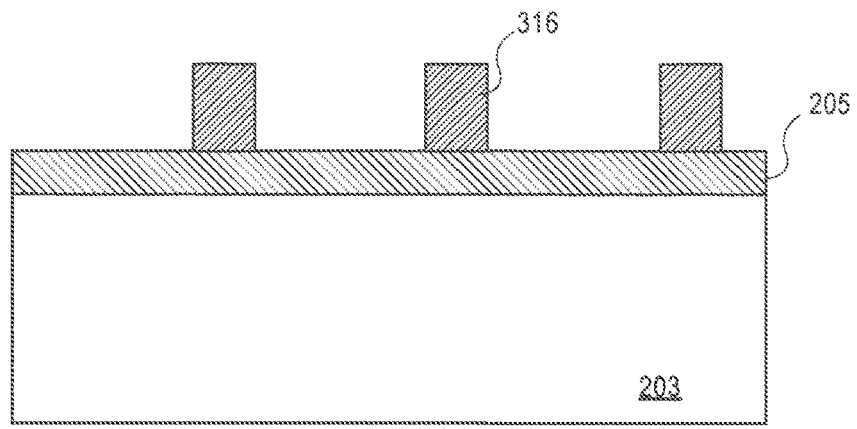
FIGS. 2A-2P are cross-sectional illustrations that illustrate a method of forming an interconnect structure with first and second dielectric caps, according to an embodiment.
Figure 2B:
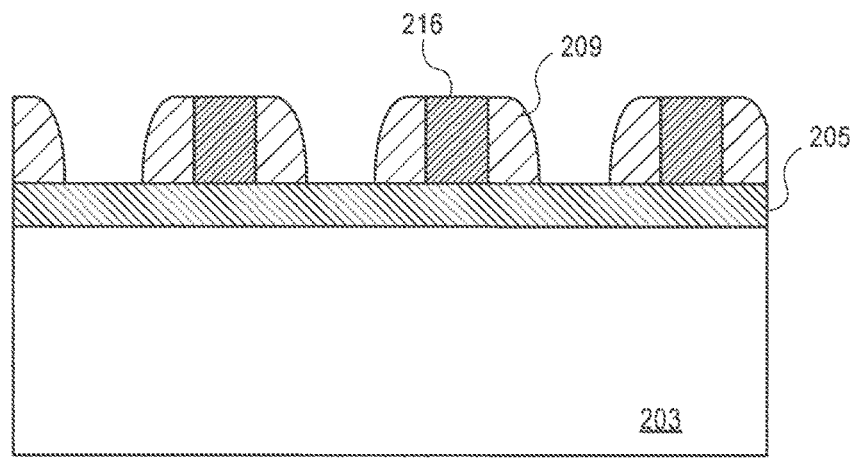
Figure 2C:
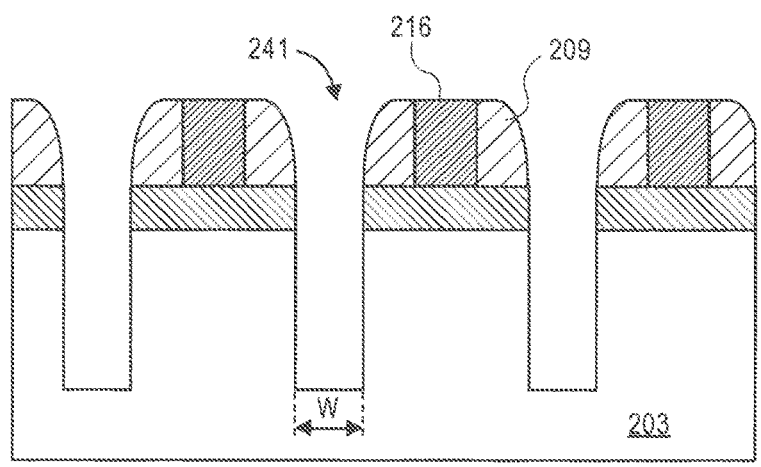
Figure 2D:
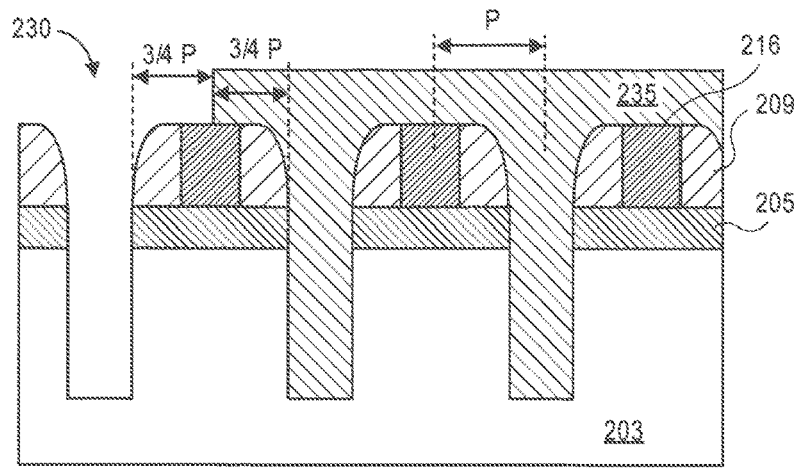
Figure 2E:
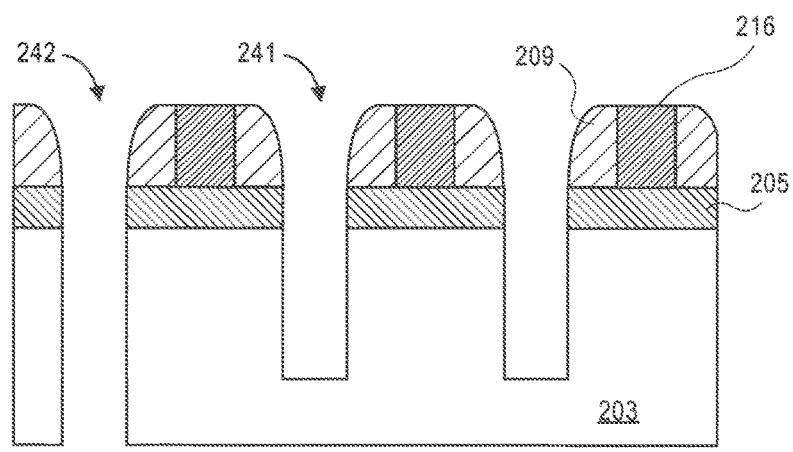
Figure 2F:
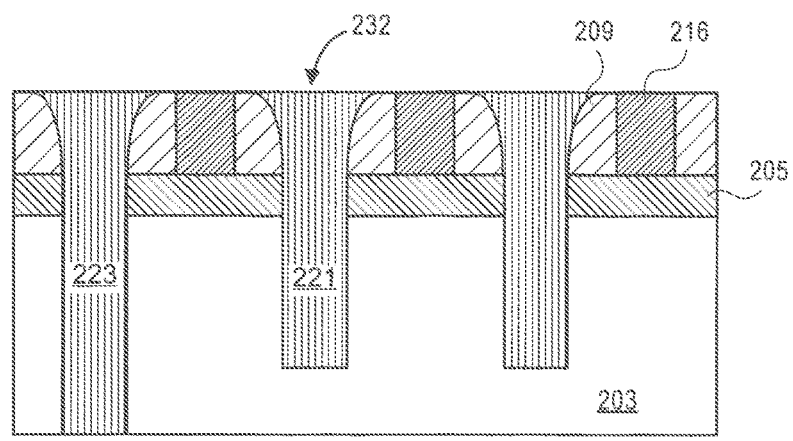
Figure 2G:
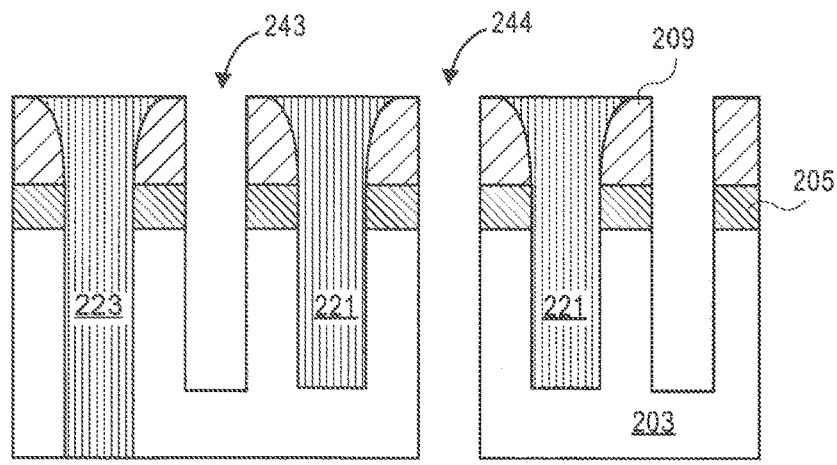
Figure 2H:
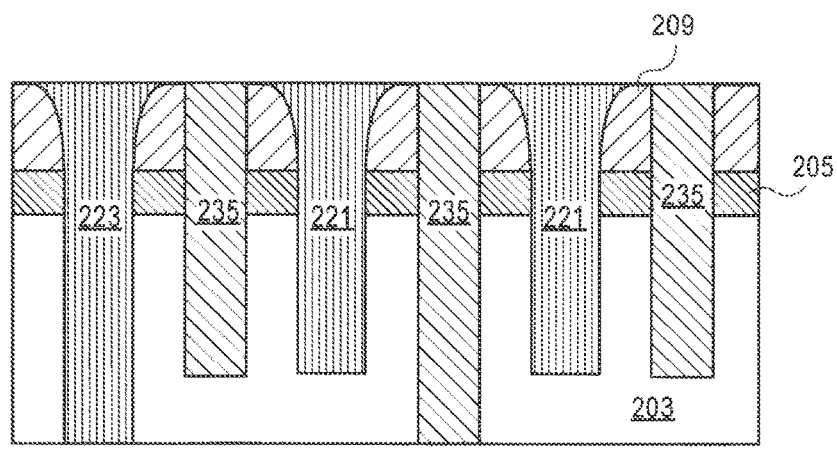
Figure 2I:
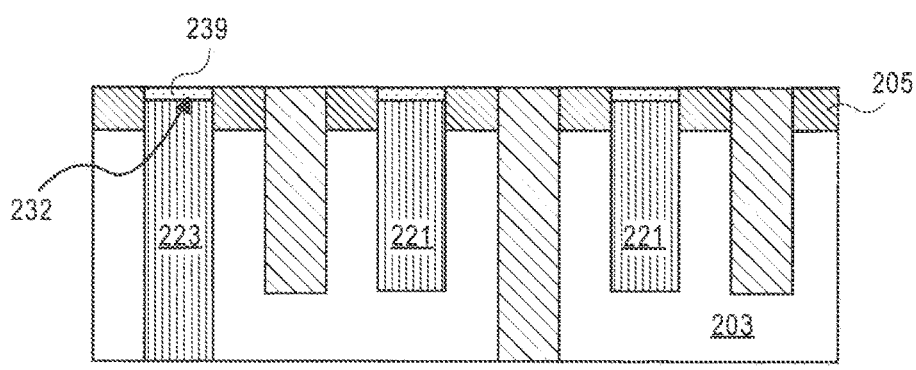
Figure 2J:
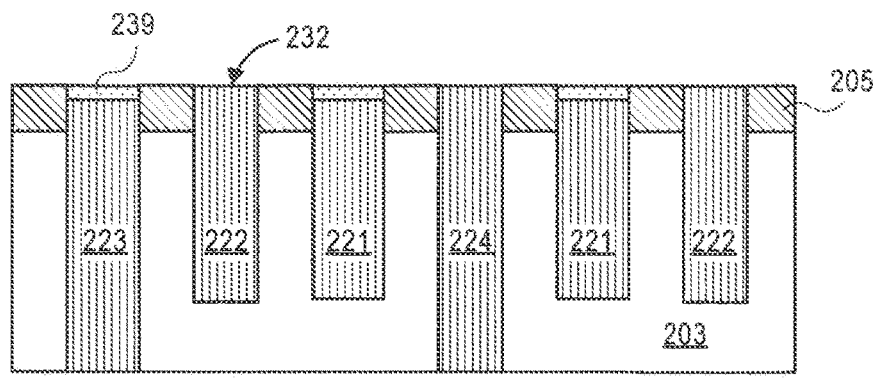
Figure 2K:
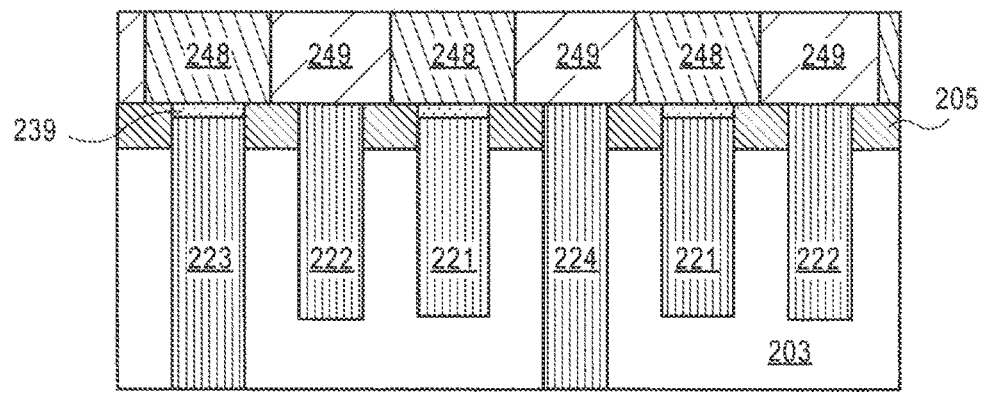
Figure 2L:
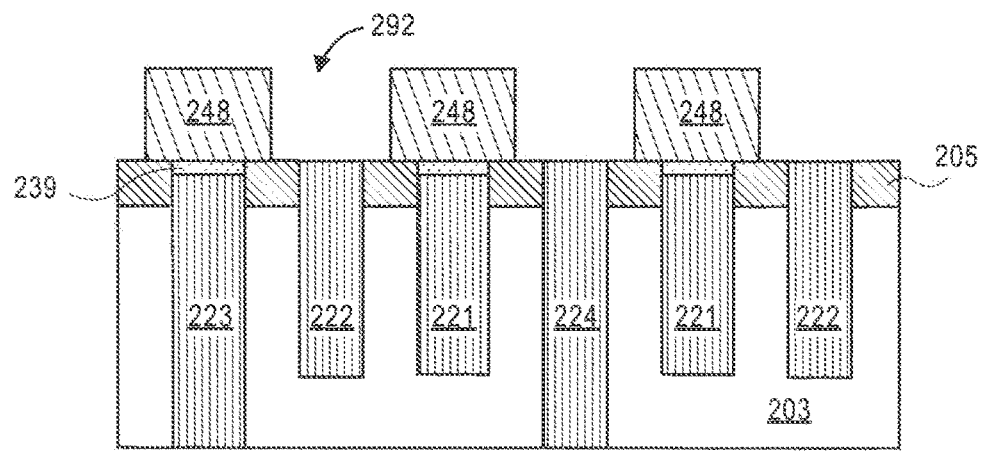
Figure 2M:
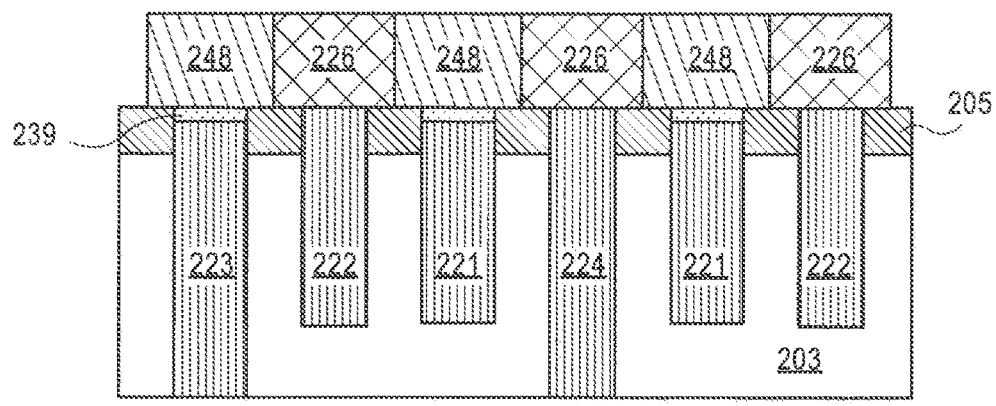
Figure 2N:
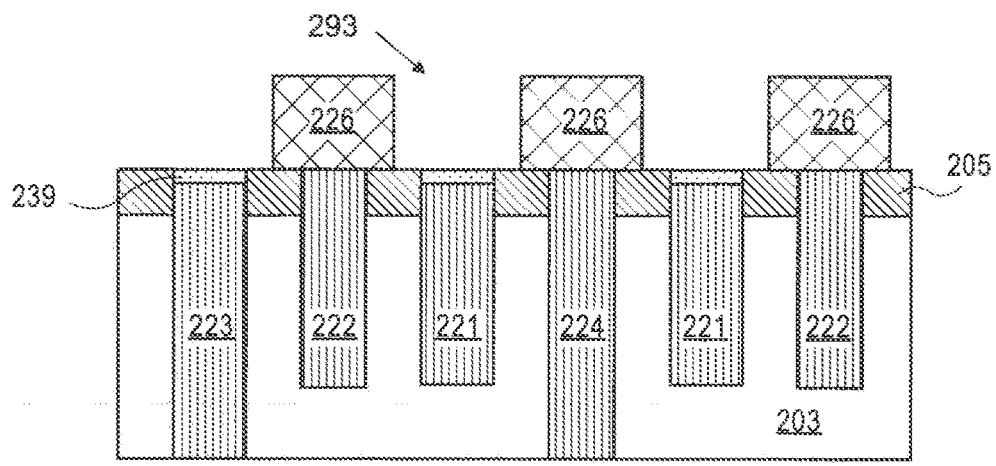
Figure 2O:
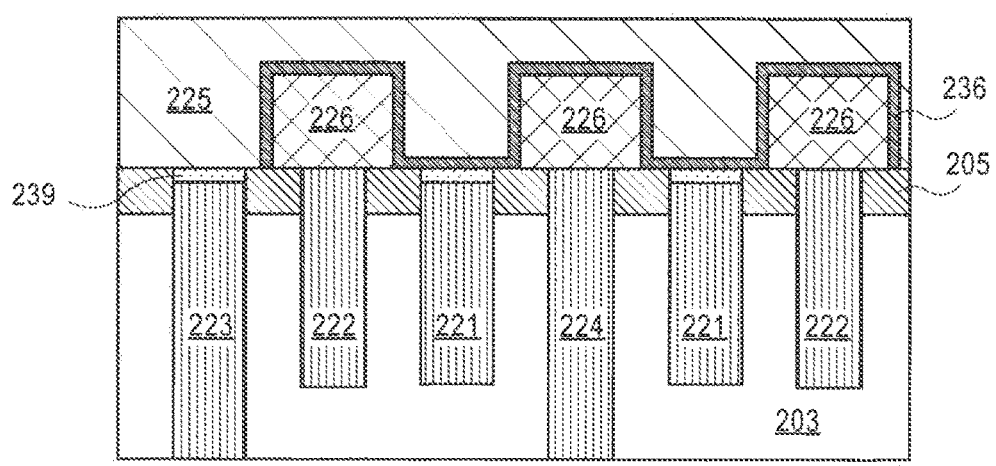
Figure 2P:
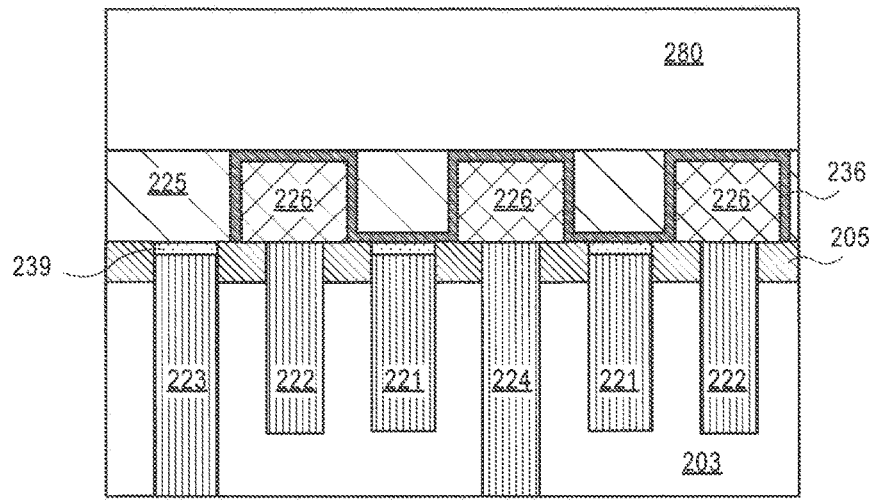

Interconnect structures according to embodiments of the invention may be manufactured according to the process described with respect to FIGS. 2A-2P. Referring now to FIG. 2A, an ILD layer 203 is shown. By way of example, the ILD layer 203 may be any ILD material known in the art, such as carbon doped silicon dioxide, porous silicon dioxide, or silicon nitrides. According to an embodiment, a first hardmask layer 205, such as a nitride or an oxide material, may be formed over the ILD layer 203. According to embodiments, ILD 203 may be formed over one or more additional interconnect structures (not shown), or ILD 203 may be formed over a device substrate, such as a semiconducting substrate on which electrical circuitry is formed (not shown).

A backbone layer 216 may be formed above the first hardmask layer 205. The backbone 216 may be any material suitable for the formation of a hardmask layer, such as amorphous silicon, polysilicon, amorphous carbon, silicon nitride, silicon carbide, germanium, or the like. The backbone 216 may be patterned with any conventional patterning process, such as lithography, etch, and wet cleans. In a specific embodiment, the backbone 216 may be formed with a multiple-patterning process in order to obtain a desired pitch.

Referring now to FIG. 2B, spacers 209 may be formed along the sidewalls of the backbone 216. A spacer formation deposition and etching process may be used to form the spacers 209. For example, a conformal layer of spacer material may be blanket deposited over the surfaces of the backbone 216 and the first hardmask layer 205. After the blanket deposition, a spacer forming etch may be implemented. Embodiments include an anisotropic dry etching process that selectively removes the portions of the deposited layer that are formed on horizontal surfaces, thereby leaving spacers 209 along the sidewalls of the backbone 216. According to an embodiment, the spacers 209 may be a conformal material, such as, but not limited to, $SiO_2$, SiN, $HfO_2$, TiO, ZrO, AN, AlO, and combinations thereof. According to an embodiment of the invention, the material used to form the backbone 316 may have a high etch selectivity over the material used to form the spacers 209 during a given etching process. According to such embodiments, the spacers 209 are resistant to an etching process that will readily etch away the backbone 216. By way of example, when the backbone 216 is made from an amorphous silicon, then the spacers 209 may be made with titanium oxide.

Referring now to FIG. 2C, a first trench etching process is used to form first trenches 241 through the first hardmask layer 205 and into the ILD 203. The first trench etching process utilizes the spacers 209 as a mask in order to provide the proper spacing between the first trenches 241 and to form the first trenches 241 with the desired width W. According to an embodiment of the invention, the width W is less than approximately 30 nm. An additional embodiment of the invention includes a width W that is less than 15 nm. In an embodiment, the first trenches 241 may have a depth between approximately 20 nm and approximately 60 nm. Additional embodiments of the invention include forming the first trenches 241 to a depth of approximately 40 nm.

Referring now to FIG. 2D, a through via masking process may be implemented according to an embodiment of the invention. A carbon hardmask 235 is formed into the trenches 241 and above the spacers 209. As illustrated in FIG. 2D, the carbon hardmask 235 may be patterned to form an opening 230 above one of the first trenches 241. According to an embodiment, the allowable error margin for defining the edges of the carbon hardmask is approximately three-quarters of the pitch P, since only the first trenches 241 have been formed. As such, the edge of the carbon hardmask 235 may be targeted to land on the center of the backbone 216 that is the immediate neighbor to the location where the via opening 230 is desired. For example, if the second trenches 244 that will subsequently be formed below the backbones 216 were already formed, then the edge of the hardmask 235 would need to be centered on the nearest neighboring spacer 209 instead of over the center of the nearest neighboring backbone 216. As such, embodiments of the invention allow for variation in the size of the opening in the hardmask 235, and the relative placement of the opening of the hardmask 235 that is approximately three times greater than the current state of the art. Specifically, embodiments of the invention allow for an error in alignment of the sidewall of the patterned carbon hardmask 235 that is approximately three-quarters of the pitch P, whereas the current state of the art allows alignment error of only one-quarter of the pitch P.

Referring now to FIG. 2E, a through via etching process etches through the remaining portions of the ILD 203 below the bottom of the first trench to form a first through via opening 242. Since the first through via opening 242 is formed though the bottom of a first trench, it is to be appreciated that the through via opening is self-aligned with first trench 241. The first through via opening 242 may provide a connection to layers or features below ILD 203. In an embodiment, the via etching process may also etch through one or more layers of a lower interconnect level, such as, for example, and etchstop layer (not shown). While a single first through via opening 242 is shown, embodiments may also include interconnect levels with more than one first through via opening 242. Subsequent to the through via etching process, the remaining portions of the carbon hardmask layer 235 are removed.

Referring now to FIG. 2F, a conductive layer may be formed in the first trenches 241 to form the first interconnect lines 221 and a first through via 223, according to an embodiment. Embodiments of the invention include first interconnect lines 221 and first through vias 223 that are formed with a conductive material that may be any conductive metal used for interconnect lines, such as Ag, Au, Co, Cu, Mo, Ni, NiSi, Pt, Ru, TiN, or W. Embodiments include disposing the conductive material into the first trenches 241 and the through via openings 242 with a deposition process known in the art, such as, but not limited to, chemical vapor deposition (CVD), atomic layer deposition (ALD), or electroplating. According to an embodiment, the top surfaces 232 of the first interconnect lines 221 may be planarized with the top surfaces of the spacers 209 in order to remove overflow material from the metal deposition. According to an embodiment, the planarization may be performed with a process such as chemical-mechanical planarization (CMP) or an etching process.

Referring now to FIG. 2G, the backbone 216 is etched away and second trenches 243 and a second through via openings 244 may be formed into the ILD 203. According to an embodiment, the remaining portions of the spacers 209 provide a masking layer for use in etching second trenches 243 and second through via openings 244. According to an embodiment, the depth of the second trenches 243 may be substantially similar to the depth of the first trenches 241. According to alternative embodiments, the depth of the second trenches 243 may be greater than or less than the depth of the first trenches 241. According to an embodiment, the process for forming the second through via openings 244 is substantially similar to the process used to form the first through via openings 242 described above with respect to FIGS. 2D and 2E, and therefore will not be repeated herein.

Referring now to FIG. 2H, a hardmask material 235 is deposited into the second trenches 243 and the second through via opening 244. In an embodiment, any overburden from the deposition process may be removed, for example with a CMP process or with an etching process.

Referring now to FIG. 2I, the interconnect structure is polished back to remove the spacers 209. For example, the polishing process may be a CMP process. During the polishing process, first interconnect lines 221 and the first through via 223 are recessed and a selective cap 239 is formed over their top surfaces. By way of example, the metallic material may be selectively recessed by increasing the chemical portion of a chemical mechanical polishing operation. By way of example, the selective cap 239 may be deposited by a variety of techniques know to those in the industry which may include physical vapor deposition (PVD), chemical vapor deposition (CVD), atomic layer deposition (ALD), or the like. The selective cap 239 may be a conductive material that is used to differentiate the surface of the first interconnect lines 221 from the surface of the second interconnect lines 222 that will be formed in a subsequent processing operation. The different surfaces are utilized to ensure proper segregation of polymers during a directed self-assembly (DSA) process that it used to form a pattern in which the first dielectric caps 225 and the second dielectric caps 226 are formed. According to an embodiment, the selective cap is any conductive material that has a different surface chemistry than the surface chemistry of the material used to form the second interconnect lines 222. In an embodiment, the selective cap 239 may be altered to have a different polarity, surface energy, or have a brush layer disposed over its top surface. In a specific embodiment, a polystyrene (PS) brush (not shown) is selectively grafted onto the selective cap 239. By way of example, and not by way of limitation, the selective cap may be a metal, such as tungsten (W), an oxide such as hafnium oxide ($HfO_X$), or alloys thereof, such as a tungsten and cobalt alloy.

In certain embodiments, the selective cap has a different resistivity than the metal used for the first interconnect lines 221. For example, when tungsten is used for the selective cap 239, its resistivity is higher than the resistivity of many commonly used interconnect materials, such as copper. Accordingly, it may be advantageous to minimize the thickness of the selective cap. In an embodiment, the thickness of the selective cap 239 may be less than the thickness of the first hardmask layer 205. In a specific embodiment, the thickness of the selective cap 239 may be less than 10 nm. Additional embodiments may include a selective cap 239 that has a thickness less than 5 nm. In an additional embodiment, a sacrificial hardmask layer (not shown) may be disposed over the selective cap 239 to protect the cap during the metal deposition and polishing operations used to form the second interconnect lines 222.

Referring now to FIG. 2J, the hardmask 235 is removed. For example, the hardmask 235 may be removed with an ashing process. Additionally, the second trenches 243 and the second through via opening 244 are filled with a conductive material and any overburden may be polished back to form the second interconnects 222 second through vias 224. In an embodiment, the conductive material may be the same conductive material used to form the first interconnects 222. In an additional embodiment, the conductive material may not be the same metal used for the first interconnects 221. By way of example, the conductive material may be any metal typically used for interconnect lines, such as copper, cobalt, tungsten, ruthenium or the like. In embodiments that utilize a sacrificial hard mask over the selective caps 239, a wet or dry etching process may be implemented after the planarization of the second interconnect lines 222 in order to expose the selective caps 239. Referring now to FIG. 2K, a DSA layer including a first polymer region 248 and a second polymer region 249 is formed over the top surface of the interconnect structure. The DSA layer is chosen such that the first polymer region selectively forms over the selective caps 239 and the second polymer region selectively forms over the second interconnect lines 222. According to an embodiment, the DSA layer is a diblock-copolymer. By way of example, the diblock copolymer may be polystyrene-b-polymethylmethacrylate (PS-b-PMMA). In such an embodiment, the PS portion (i.e., the first polymer region 248) is driven towards the selective caps 239, while the PMMA portion (i.e., the second polymer region 249) is driven away from the selective caps 239. Embodiments that include a PS brush formed over the surface of the selective cap 239 may further improve the segregation of the PS portion 248 and the PMMA portion 249. For example, thiol chemistry on the tail end of the PS brush may attract the PS portion 248 to the selective cap 239. While thiol chemistry is used as an exemplary embodiment, other tail end chemistries may also selectively attract the first polymer region 248 (e.g., phosphonic acid selectively attracts the PS portions 248). According to an embodiment, segregation of the DSA layer may also be driven or accelerated by annealing the DSA layer. While PS-b-PMMA is described as an exemplary embodiment, it is to be appreciated that many different materials, such as diblock copolymers, triblock copolymers (e.g., ABA, or ABC), or self-segregating combinations of homopolymers may be used.

Referring now to FIG. 2L, the second polymer region 249 is selectively removed. For example, the second polymer region 249 may be removed with a wet or dry etch chemistry. In embodiments that utilizes a PS-b-PMMA diblock copolymer, the wet or dry etching process will selectively remove the PMMA portion 249. The removal of the second polymer region 249 results in the formation of openings 292 that are selectively formed above the second interconnect lines 222, while the first interconnect lines remain covered by the first polymer region 248.

Referring now to FIG. 2M, the openings 292 are filled with a second dielectric cap 226. For example, the second dielectric caps 226 may be deposited with a CVD, PVD, or spin on process. According to an embodiment, any overburden material may be recessed with a planarization process, such as a CMP process, so that the top surfaces of the second dielectric caps 226 are substantially coplanar with the top surfaces of the first polymer region 248. Embodiments of the invention may utilize a material such as $SiO_xC_yN_z$, $SiO_xC_y$, non-conductive metal oxides, or metal nitrides for the second dielectric caps 226. Additional embodiments of the invention may select a material for the second dielectric caps 226 that has a high etch selectivity over first hardmask layer 205.

Referring now to FIG. 2N, the first polymer region 248 may be removed. For example, the first polymer region 248 may be removed with an ashing process. As such, openings 293 are formed over the first dielectric caps 221 and the first through vias 223.

Referring now to FIG. 2O, the a dielectric material may be deposited into the openings 293 to form the first dielectric caps 225. For example, the first dielectric caps 225 may be deposited with a CVD, PVD, or spin on process. Embodiments of the invention may utilize a material such as $SiO_xC_yN_z$, $SiO_xC_y$, non-conductive metal oxides, or metal nitrides for the first dielectric caps 225. Additional embodiments of the invention may select a material for the first dielectric caps 225 that has a high etch selectivity over first hardmask layer 205. According to an embodiment, an etchstop liner 236 may be formed over the surfaces of the second dielectric caps 226, the first hardmask 205, and the selective caps 339 prior to depositing the first dielectric material for the first dielectric caps 225.

Referring now to FIG. 2P, any overburden material from the first dielectric caps may be recessed with a planarization process, such as a CMP process, so that top surfaces of the first dielectric caps are substantially coplanar with top surfaces of the etchstop liner 236. In embodiments that omit the etchstop liner 236, the top surfaces of the first dielectric caps 225 may be substantially coplanar with the top surfaces of the second dielectric caps 226. Thereafter, a second ILD layer 280 may be deposited over the top surfaces to allow for patterning of an additional interconnect layer, according to an embodiment.

Embodiments of the invention allow for improved contact formation to tightly pitched interconnect lines. As described above, tightly pitched interconnect lines require increasingly precise alignment to form contacts to the desired interconnect lines. However, as shown in the contact formation process illustrated in FIG. 3, an interconnect structure that includes first and second dielectric caps 325, 326 and an etchstop liner 336 allows for the contacts to be wider and have a greater margin of alignment error due to the etch selectivities of the dielectric caps, the hardmask layer, and the etchstop liner.

Figure 3:
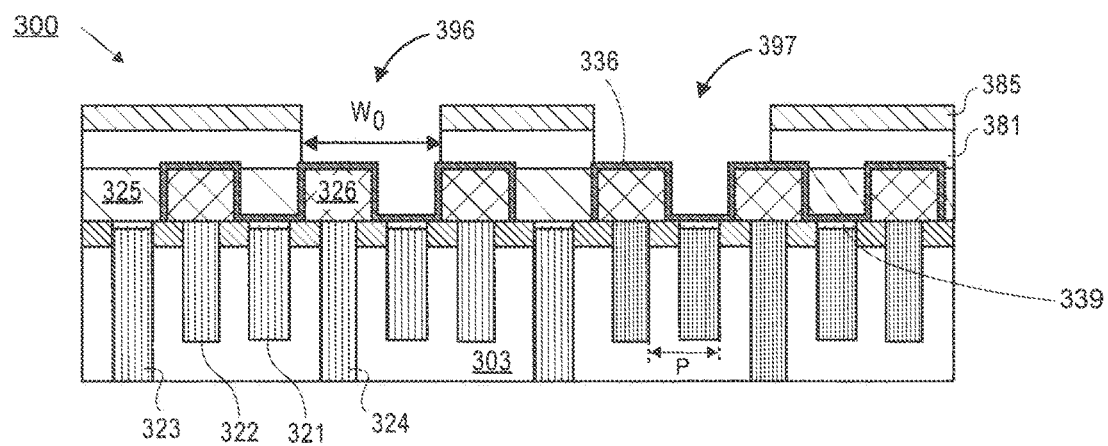
FIG. 3 is a cross-sectional illustrations that illustrate contact openings formed in an interconnect structure that includes first and second dielectric caps, according to an embodiment.

Referring now to FIG. 3, an interconnect structure 300 that is substantially similar to interconnect structure 100 in FIG. 1A is illustrated. Interconnect structure 300 further includes a sacrificial material 385 that is formed over a second ILD 381. The sacrificial material 385 may be patterned (e.g., with a lithography process) to form a first opening 396 and a second opening 397. The pattern of the first opening 396 and the second opening 397 may be transferred into the second ILD 381 with an etching process. An etching process may also selectively remove the exposed first dielectric caps 325 formed in the openings. Due to the etch selectivities between the first dielectric caps 325, the second dielectric caps 326, and the etchstop liner 336, the etching process may selectively remove only the first dielectric caps 325 even though the second dielectric caps 326 and the etchstop liner 336 are also exposed in each of the openings.

The etch selectivities allow for the first and second opening to have a width $W_O$ that is greater than the pitch P. For example, the first opening extends over a neighboring second through via 324 and the second opening extends over both neighboring interconnects. However, due to the etch selectivity, only the first interconnect lines 321 will be contacted. As illustrated, the etchstop liner 336 is still formed over the first interconnect lines. Accordingly, an additional etching process may be implemented to selectively remove the etchstop liner 336. Since the etchstop liner 336 has a high selectivity to the second dielectric cap 326, the etching process allows for only the first interconnect lines 321 to be exposed. For example, the etchstop liner 336 may be etched with a wet etching process that does not significantly remove the second dielectric cap 326. Accordingly, the width of the contacts may be larger than otherwise possible, and misalignment errors do not result in unwanted short-circuiting to neighboring interconnects. The larger width of the contacts also eases demands on fabrication equipment and may provide a higher yield.

Figure 4A:
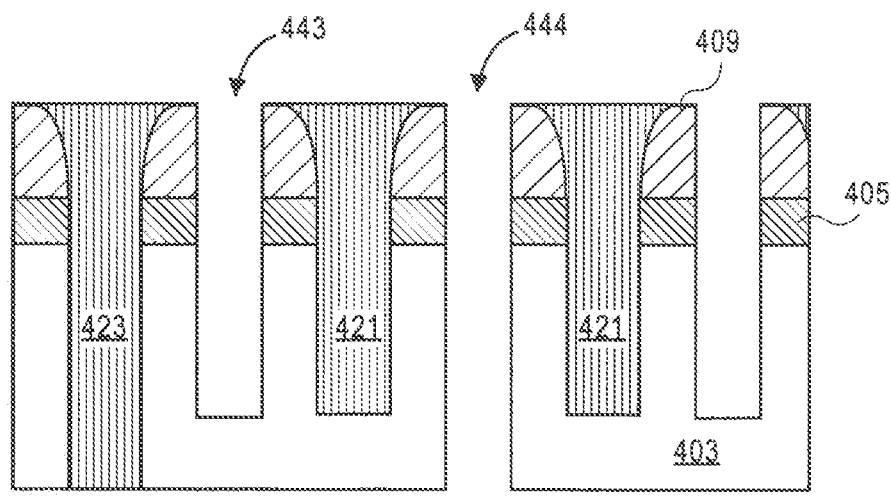
FIGS. 4A-4H are cross-sectional illustrations that illustrate a method of forming an interconnect structure with first and second dielectric caps, according to an embodiment.
Figure 4B:
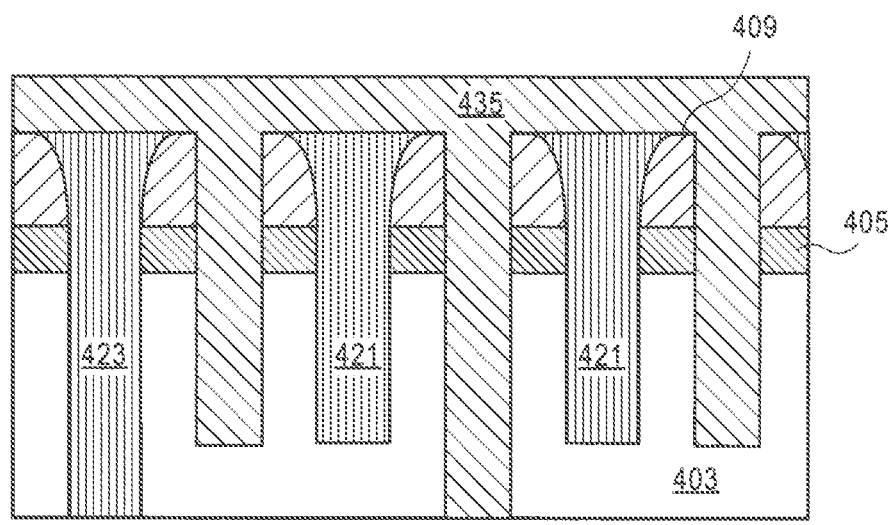

Interconnect structures 101 and/or 102 illustrated in FIG. 1B and 1C may be manufactured according to the process described with respect to FIGS. 4A-4H, according to embodiments of the invention. Referring now to FIG. 4A, a structure substantially similar to the one illustrated in FIG. 2G is illustrated. Accordingly, the processing operations used to form the structure illustrated in FIG. 4A may be substantially similar to those described above with respect to FIGS. 2A-2G, and therefore will not be repeated here. Referring now FIG. 4B, a sacrificial hardmask material 435 is deposited into the second trenches 443 and the second through via opening 444.

Figure 4C:
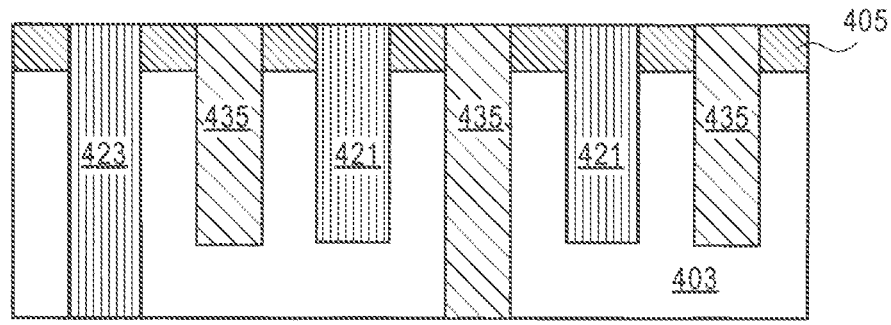

Referring now to FIG. 4C, the interconnect structure is polished back to remove the spacers 409 and any overburden material 435 from the sacrificial hardmask deposition process. For example, the polishing process may be a CMP process. As illustrated, the top surfaces of the first interconnect lines 421, the first hardmask 405 and sacrificial hardmask 435 may be substantially coplanar with each other.

Figure 4D:
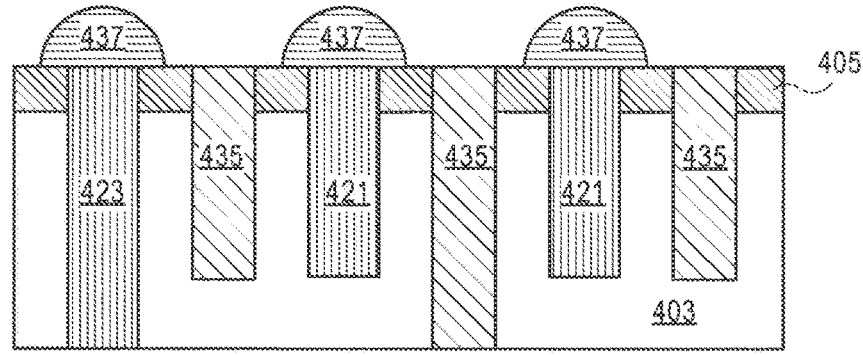

Referring now to FIG. 4D, first dielectric caps 437 are formed over the top surfaces of the first interconnect lines 421. In an embodiment, the first dielectric caps 437 may be a metallic oxide that is selectively deposited or grown over only the first interconnect lines 421. The first dielectric caps 437 selectively form over the metallic surfaces of the first interconnect lines and through vias and do not form over the non-metallic first hardmask layer 405 and sacrificial hardmask 435. By way of example, suitable oxides may include hafnium oxides, zirconium oxides, titanium oxides, aluminum oxides, or the like. According to an embodiment, the shape of the first dielectric caps 437 may be dependent on the deposition or growth characteristics of the oxide. As illustrated, the first dielectric caps may form a "rivet head" shape. However, it is to be appreciated that the exact growth or deposition pattern of the first dielectric caps 437 is not limited to the pattern illustrated in FIG. 4D. In an embodiment, the first dielectric caps 437 may be characterized by having sidewalls that are not substantially vertical. In an embodiment, the first dielectric caps 437 may extend over the top surface of the first hardmask layer 405 proximate to the first interconnect lines 421.

Figure 4E:
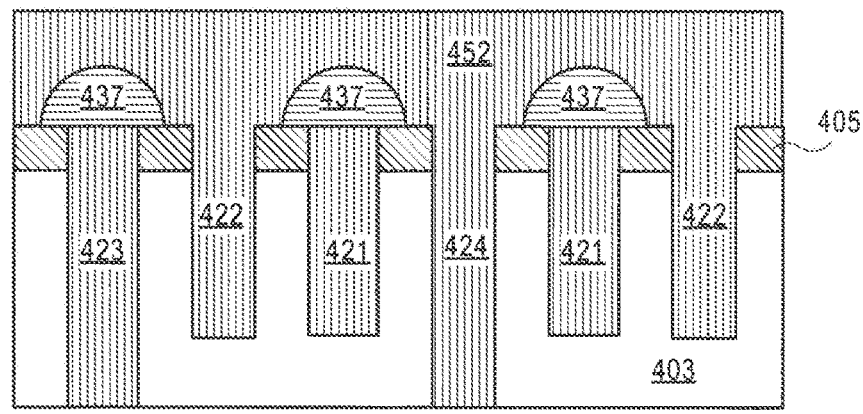

Referring now to FIG. 4E, the hardmask 435 is removed. For example, the hardmask 435 may be removed with an ashing process. Additionally, the second trenches and the second through via openings are filled with a conductive material 452 to form the second interconnects 422 and second through vias 424. In an embodiment, the conductive material 452 may be the same conductive material used to form the first interconnects 422. In an additional embodiment, the conductive material 452 may not be the same metal used for the first interconnects 421. By way of example, the conductive material may be any metal typically used for interconnect lines, such as copper, cobalt, tungsten, ruthenium or the like the.

Figure 4F:
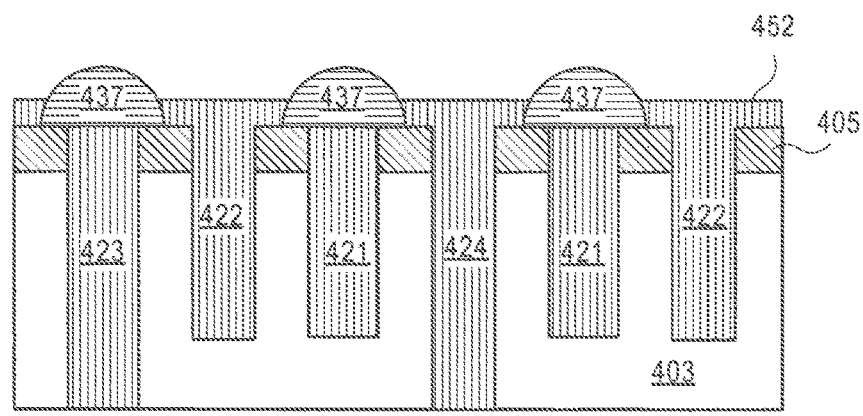

Referring now to FIG. 4F, a portion of the overburden conductive material 452 may be polished back, for example, with a CMP process. According to an embodiment, the polishing process may be stopped once the top surfaces of the first dielectric caps 437 are exposed. However, the chemical portion of a CMP process may recess the conductive material 452 so that a top surface of the conductive material is formed below a top surface of the first dielectric caps 437.

Figure 4G:
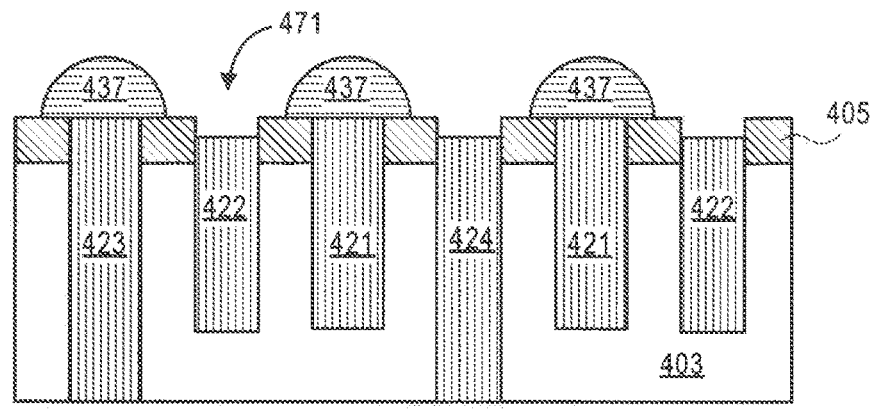

Referring now to FIG. 4G, the remaining overburden conductive material 452 is etched back. In an embodiment, the etching process may form recesses 471 above the second interconnect lines 422 and the second through vias 424. In an embodiment, the recesses expose a portion of the trenches in which the second interconnect lines 422 and the second through vias 424 are formed. By way of example, the etching process may be a wet or dry etching process, depending on the material used for the conductive material.

Figure 4H:
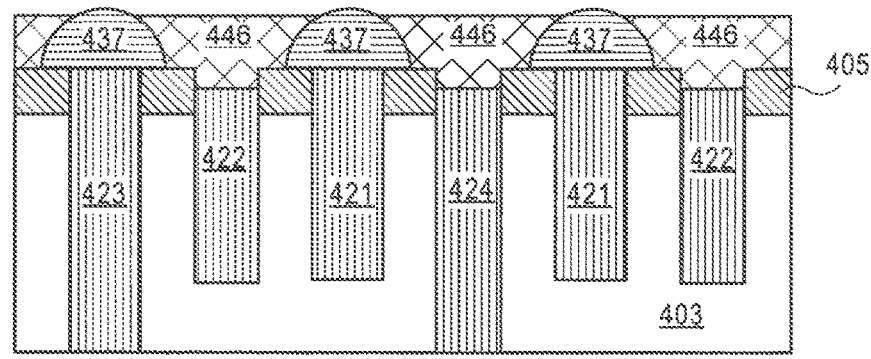

Referring now to FIG. 4H, a second dielectric cap 446 is formed over the second interconnect lines 422 and the second through vias 424. According to an embodiment, the second dielectric caps may also be characterized as having sidewalls that are not substantially vertical. For example, the second dielectric caps 446 may have sidewalls that are characterized as having a shape that is complementary to the sidewalls of the first dielectric caps. In the illustrated embodiment, the second dielectric caps 446 may have a shape that is substantially an "upside down rivet head". Additional embodiments may include sidewalls of the second dielectric caps 446 that are characterized by having a first portion that is substantially vertical and a second portion that is not substantially vertical. The vertical portion of the sidewall is defined by a sidewall of the trench in which the second interconnect lines 422 and second through vias 424 are formed and the second portion is defined by the shape of the sidewalls of the first dielectric cap 137. In an embodiment the second dielectric cap may be any dielectric material that is selectively etched with respect to the first dielectric caps 437. By way of example, the second dielectric caps may be SiC, SiN, SiOC, or a spun-on metal oxide, such as ZrO, TiO, or the like. In an embodiment, any overburden material from the deposition of the second dielectric cap 446 may be polished back so that top surfaces of the first dielectric caps 437 are substantially coplanar with top surfaces of the second dielectric caps. According to an additional embodiment, an etchstop liner (not shown) may be formed over the surfaces of the first dielectric caps 437, the first hardmask layer 405, the second interconnect lines 422, and the second through vias 424 prior to depositing the second dielectric cap 446. In such embodiments, a top surface of the second dielectric caps 446 may be planarized with a top surface of the portion of the etchstop liner formed above the top surface of the first dielectric caps 437.

Referring now to FIG. 5A-5K, an process for forming an interconnect structure with first dielectric caps and second dielectric caps formed over interconnect lines is illustrated. According to this additional embodiment self-segregation of polymer regions in a DSA process is used in order to form a pattern in the DSA layer that may then be used to etch the trenches for the second interconnect lines.

Figure 5A:
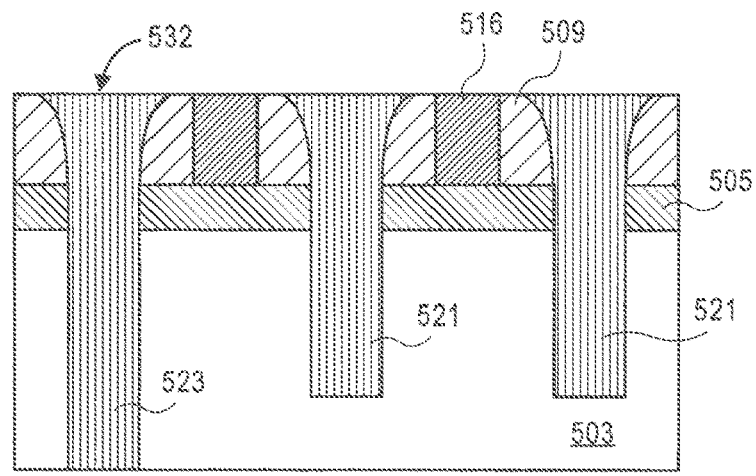
Figure 5B:
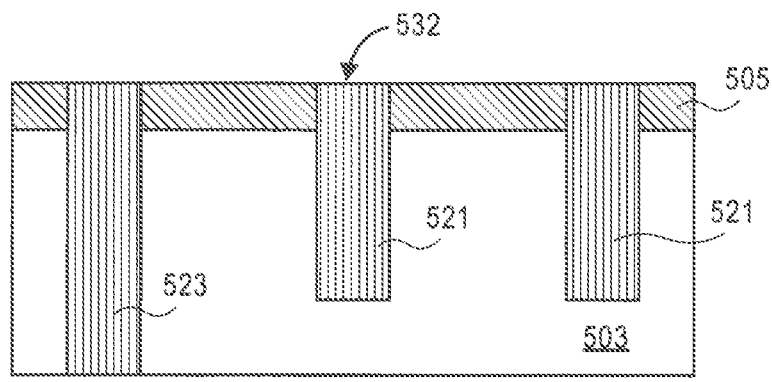

Referring now to FIG. 5A, a structure substantially similar to the one illustrated in FIG. 2F is illustrated. Accordingly, the processing operations used to form the structure illustrated in FIG. 5A may be substantially similar to those described above with respect to FIGS. 2A-2F, and therefore will not be repeated here. Referring now FIG. 5B, the spacers 509 and the backbone 516 are removed. For example, the spacers 509 and the backbone 516 may be removed with a polishing process, such as a CMP process. The polishing process exposes the first interconnect lines 521, the first through via 523, and the first hardmask layer 505.

Figure 5C:
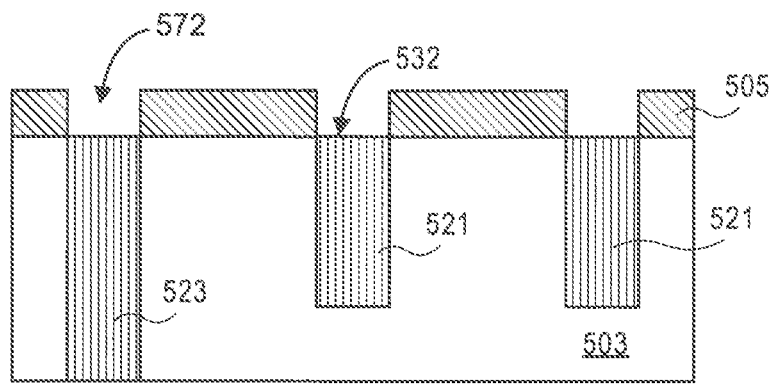

Referring now to FIG. 5C, recesses are formed into the first interconnect lines 521 and the first through via 523. According to an embodiment the recesses 572 may cause the top surfaces of the first interconnect lines 521 and the first through via 523 to be substantially coplanar with a bottom surface of the first hardmask layer 505. In a different embodiment, the recess 527 may cause the top surfaces of the first interconnect lines 521 and the first through via 523 to be above or below a bottom surface of the first hardmask layer 505.

Figure 5D:
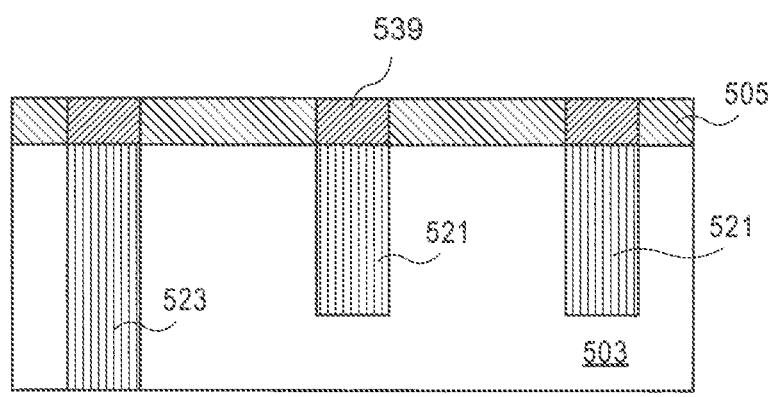

Referring now to FIG. 5D, the recesses 572 are filled with a selective cap 539. In an embodiment, the selective cap 539 may be substantially similar to the selective cap 139 described in greater detail above. For example, the selective cap may be a metal, such as tungsten (W), an oxide such as hafnium oxide ($HfO_X$), or alloys thereof, such as a tungsten and cobalt alloy. In an embodiment, the selective cap 539 may be deposited by a variety of techniques know to those in the industry which may include physical vapor deposition (PVD), chemical vapor deposition (CVD), atomic layer deposition (ALD), etc Additionally, embodiments of the invention may include a selective cap 539 that is substantially thicker than the selective cap 139 described above with respect to FIG. 1A. The thickness of the selective cap 539 may be greater than the selective cap described above, because selective cap 539 will not be included in the final interconnect structure, according to an embodiment. As such, the increased resistivity of the selective cap 539 does not reduce the efficiency of the final device formed according to embodiments described with respect to FIGS. 5A-5K.

Figure 5E:
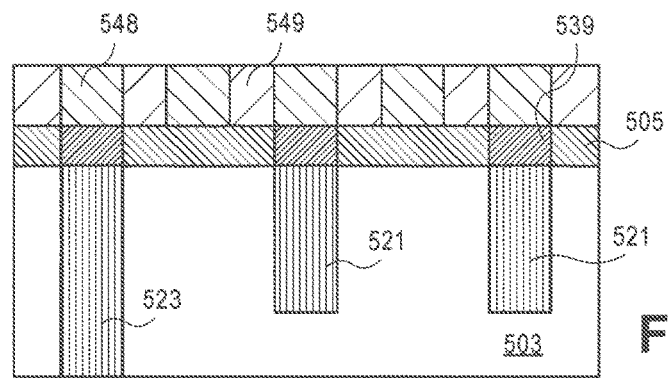

Referring now to FIG. 5E, a DSA layer including a first polymer region 548 and a second polymer region 549 is formed over the top surface of the interconnect structure. The DSA layer is chosen such that the first polymer region 548 selectively forms over the selective caps 539 and the second polymer region 549 forms over the first hardmask layer 505. In one embodiment, pattern multiplication is also possible such that the first polymer region 548 and the second polymer region 549. For example, the phases may align with a frequency that is greater than 1:1 with respect to the selective caps 539, yet still maintain the periodic geometry due to the natural tendency of the DSA layer to micro-phase separate. In the embodiment illustrated in FIG. 5E, the first polymer regions 548 repeat at a 2:1 frequency with respect to the selective caps 539. By way of example, the degree of pattern multiplication may be modified by modulating the length of the polymers in the DSA layer, or by annealing the DSA layer.

According to an embodiment, the DSA layer is a diblock-copolymer. By way of example, the diblock copolymer may be polystyrene-b-polymethylmethacrylate (PS-b-PMMA). In such an embodiment, the PS portion (i.e., the first polymer region 548) is driven towards the selective caps 539, while the PMMA portion (i.e., the second polymer region 549) is driven away from the selective caps 539. According to an embodiment, segregation of the DSA layer may also be driven or accelerated by annealing the DSA layer. While PS-b-PMMA is described as an exemplary embodiment, it is to be appreciated that many different materials, such as diblock copolymers, triblock copolymers (e.g., ABA, or ABC), or self-segregating combinations of homopolymers may be used.

Figure 5F:
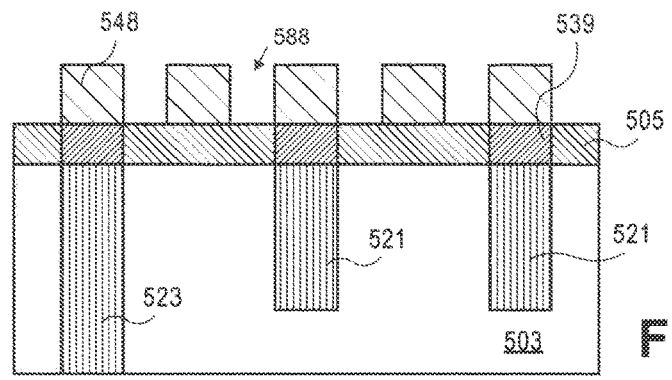

Referring now to FIG. 5F, the second polymer region 549 is selectively removed. For example, the second polymer region 549 may be removed with a wet or dry etch chemistry. In embodiments that utilizes a PS-b-PMMA diblock copolymer, the wet or dry etching process will selectively remove the PMMA portion 549. The removal of the second polymer region 549 results in the formation of openings 588 that are selectively formed above the first hardmask layer 505, while the first interconnect lines remain covered by the first polymer region 548.

Figure 5G:
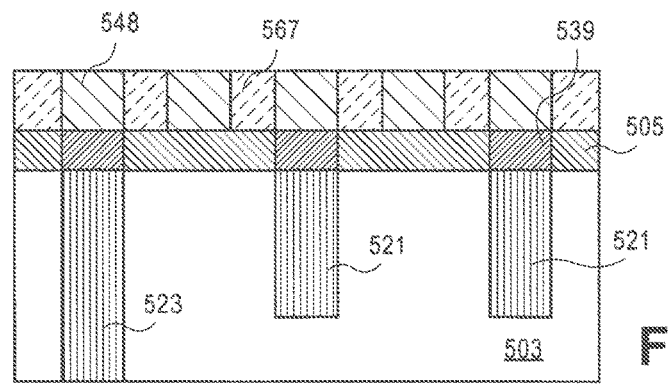

Referring now to FIG. 5G, the openings 588 may be filled with a sacrificial hardmask material 567. By way of example, the sacrificial hardmask material may be a carbon hardmask that is deposited with a CVD process. In an embodiment, the sacrificial hardmask material 567 is planarized with a top surface of the first polymer region 548, for example with a CMP process.

Figure 5H:
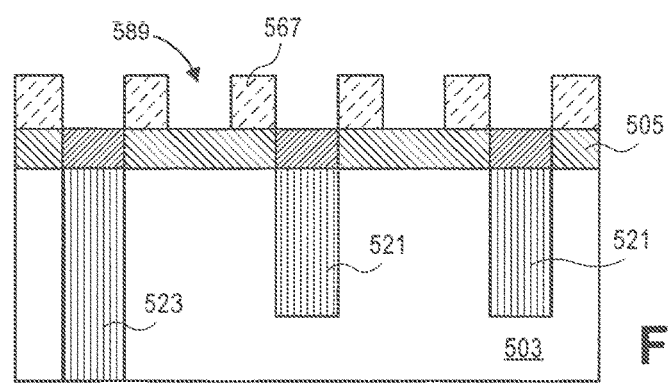

Referring now to FIG. 5H, the first polymer region 548 is removed. By way of example, the first polymer region may be removed with a wet or dry etching process that is selective to the sacrificial hardmask material 567. After the removal of the first polymer region 548, openings 589 are formed above the first interconnect lines 521 and over the first hardmask layer 505.

Figure 5I:
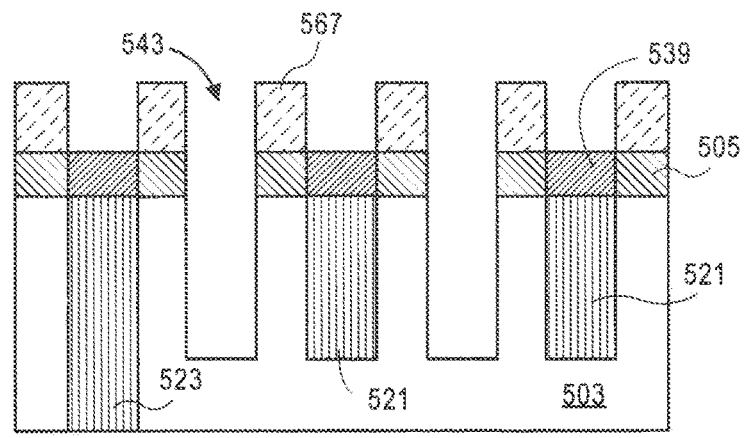

Referring now to FIG. 5I, the sacrificial hardmask material 567 is used as an etch mask to selectively form second trenches 543 through the first hardmask layer 505 and into the ILD 503. In an embodiment, the hardmask layer 505 and the ILD 503 may be removed with a wet or dry etching process that is selective to the selective caps 539 formed over the first interconnect lines 521. Accordingly, the use of the DSA process to form the sacrificial hardmask 567 allows for the formation of second trenches in an alternating pattern with the first interconnect lines 521.

Figure 5J:
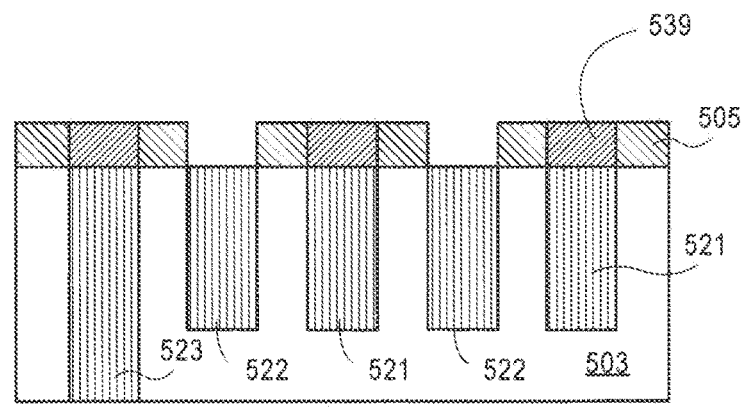

Referring now to FIG. 5J, conductive material may be deposited in the second trenches 543 to form the second interconnect lines 522. In an embodiment, any overburden may be polished back or etched back. In an additional embodiment, a top surface of the second interconnect lines 522 may be recessed to be below the first hardmask layer 505. For example, an etching process may selectively recess the second interconnect lines 522 without substantially etching away the selective caps 539.

Figure 5K:
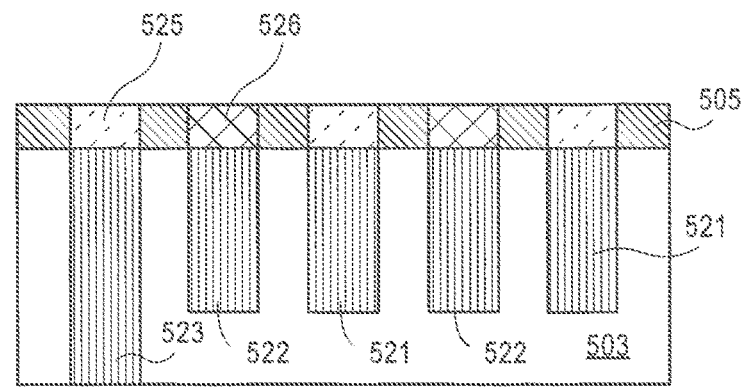

Referring now to FIG. 5K, a second dielectric cap 526 may be formed above each of the second interconnect lines 522. For example, the dielectric material may be deposited with a CVD, PVD, or spin on process. According to an embodiment, any overburden material may be recessed with a planarization process, such as a CMP process, so that top surfaces of the second dielectric caps 526 are substantially coplanar with a top surface of the first hardmask layer 505. Embodiments of the invention may utilize a material such as $SiO_xC_yN_z$, $SiO_xC_y$, non-conductive metal oxides, or metal nitrides for the second dielectric caps 526. Additional embodiments of the invention may select a material for the second dielectric caps 526 that has a high etch selectivity over first hardmask layer 505 and over the first dielectric caps 525.

After the deposition of the second dielectric caps 526, the selective caps 539 may be removed, for example with a wet or dry etching process. In an embodiment, first dielectric caps 525 may then be formed above the first interconnect lines 521 and the first through vias 523. For example, the dielectric material may be deposited with a CVD, PVD, or spin on process. According to an embodiment, any overburden material may be recessed with a planarization process, such as a CMP process, so that top surfaces of the first dielectric caps 525 are substantially coplanar with a top surface of the first hardmask layer 505. Embodiments of the invention may utilize a material such as $SiO_xC_yN_z$, $SiO_xC_y$, non-conductive metal oxides, or metal nitrides for the first dielectric caps 525. Additional embodiments of the invention may select a material for the first dielectric caps 525 that has a high etch selectivity over first hardmask layer 505 and over the second dielectric caps 526.

Accordingly, embodiments of the invention allow for the formation of first interconnect lines and second interconnect lines formed in an alternating pattern with dielectric caps having different etch selectivities formed over them. Embodiments of the invention include using a DSA process that is capable of pattern multiplication in order to form the alternating pattern of first interconnect lines and second interconnect lines.

Figure 6:
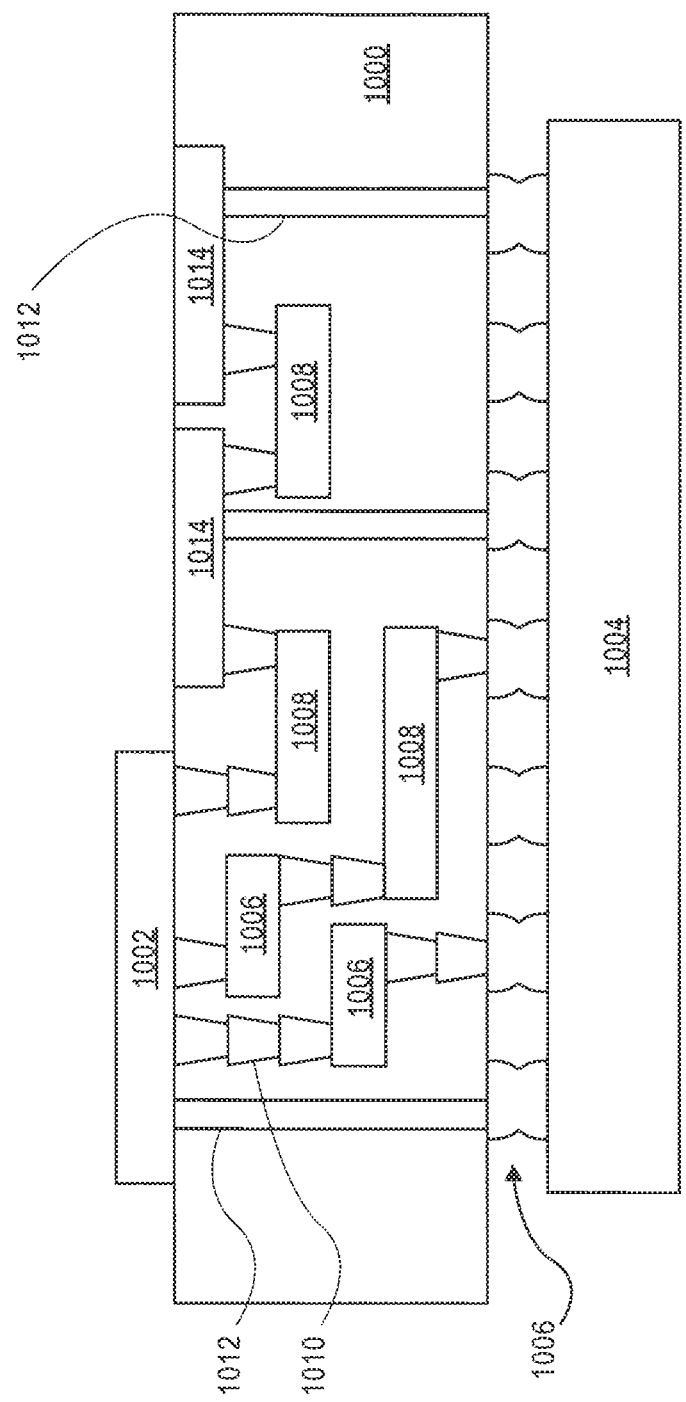
FIG. 6 is a cross-sectional illustration of an interposer implementing one or more embodiments of the invention.

FIG. 6 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the invention, apparatuses or processes disclosed herein for forming an interconnect structure that includes alternating dielectric caps formed above a hardmask layer with a DSA process may be used in the fabrication of interposer 1000, or in the fabrication of the embedded devices 1014.

Figure 7:
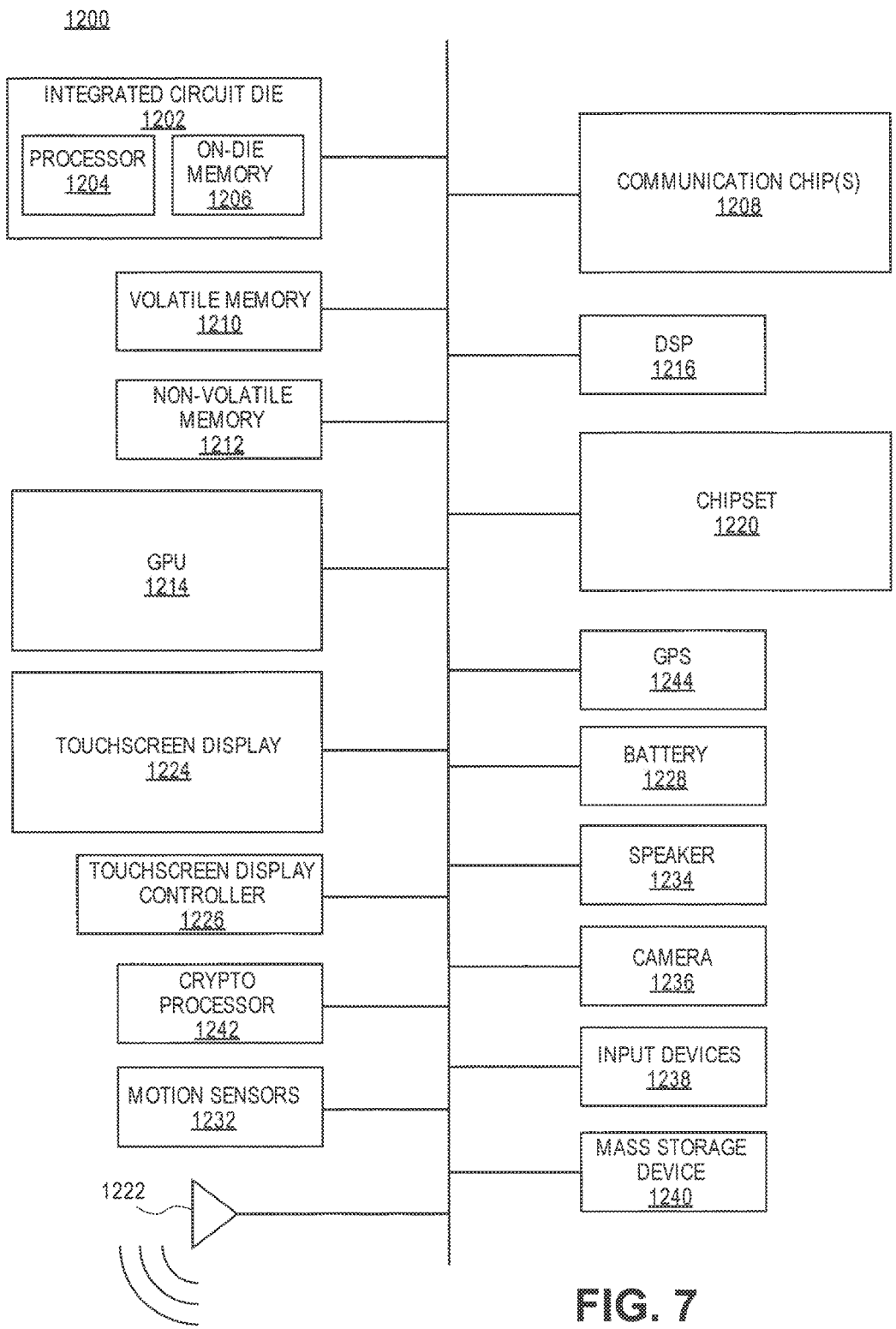
FIG. 7 is a schematic of a computing device built in accordance with an embodiment of the invention.

FIG. 7 illustrates a computing device 1200 in accordance with one embodiment of the invention. The computing device 1200 may include a number of components. In one embodiment, these components are attached to one or more motherboards. In an alternate embodiment, these components are fabricated onto a single system-on-a-chip (SoC) die rather than a motherboard. The components in the computing device 1200 include, but are not limited to, an integrated circuit die 1202 and at least one communication chip 1208. In some implementations the communication chip 1208 is fabricated as part of the integrated circuit die 1202. The integrated circuit die 1202 may include a CPU 1204 as well as on-die memory 1206, often used as cache memory, that can be provided by technologies such as embedded DRAM (eDRAM) or spin-transfer torque memory (STTM or STTM-RAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (a specialized processor that executes cryptographic algorithms within hardware), a chipset 1220, an antenna 1222, a display or a touchscreen display 1224, a touchscreen controller 1226, a battery 1228 or other power source, a power amplifier (not shown), a global positioning system (GPS) device 1228, a compass 1230, a motion coprocessor or sensors 1232 (that may include an accelerometer, a gyroscope, and a compass), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth).

The communications chip 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1208. For instance, a first communication chip 1208 may be dedicated to shorter range wireless communications such as Wi-Fi and Bluetooth and a second communication chip 1208 may be dedicated to longer range wireless communications such as GPS, EDGE, GPRS, CDMA, WiMAX, LTE, Ev-DO, and others.

The processor 1204 of the computing device 1200 includes one or more devices, such as transistors, that are coupled to one or more interconnect lines in an interconnect structure that includes alternating dielectric caps formed above a hardmask layer with a DSA process, in accordance with embodiments of the invention. The term "processor" may refer to any device or portion of a device that processes electronic data from registers and/or memory to transform that electronic data into other electronic data that may be stored in registers and/or memory.

The communication chip 1208 may also include one or more devices, such as transistors, that are coupled to one or more interconnect lines in an interconnect structure that includes alternating dielectric caps formed above a hardmask layer with a DSA process, in accordance with embodiments of the invention.

In further embodiments, another component housed within the computing device 1200 may contain one or more devices, such as transistors, that are coupled to one or more interconnect lines in an interconnect structure that includes alternating dielectric caps formed above a hardmask layer with a DSA process, in accordance with embodiments of the invention.

In various embodiments, the computing device 1200 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include an interconnect structure comprising: an interlayer dielectric (ILD) with a first hardmask layer over a top surface of the ILD; one or more first interconnect lines in the ILD; a first dielectric cap positioned above each of the first interconnect lines, wherein a surface of the first dielectric cap contacts a top surface of the first hardmask layer; one or more second interconnect lines in the ILD arranged in an alternating pattern with the first interconnect lines; and a second dielectric cap over a top surface of each of the second interconnect lines, wherein a surface of the second dielectric cap contacts a top surface of the first hardmask layer. Additional embodiments include an interconnect structure, further comprising a selective cap positioned over a top surface of each of the first interconnect lines. Additional embodiments include an interconnect structure, wherein the selective cap is a different material than the second interconnect lines. Additional embodiments include an interconnect structure, wherein the selective cap is tungsten (W), $HfO_X$, or an alloy of tungsten and cobalt alloy. Additional embodiments include an interconnect structure, wherein the selective cap has a thickness that is less than a thickness of the first hardmask layer. Additional embodiments include an interconnect structure, wherein the thickness of the selective cap is less than 5 nm. Additional embodiments include an interconnect structure, wherein the sidewalls of the first and second dielectric caps are substantially vertical. Additional embodiments include an interconnect structure, wherein a centerline of each first dielectric cap is substantially aligned with a centerline of a first interconnect line Additional embodiments include an interconnect structure, wherein the sidewalls of the first and second dielectric caps are not substantially vertical. Additional embodiments include an interconnect structure, wherein the sidewalls of the second dielectric caps are complementary to the sidewalls of the first dielectric caps. Additional embodiments include an interconnect structure, wherein a first portion of the sidewalls of the second dielectric caps are substantially vertical and a second portion of the sidewalls of the second dielectric caps are not substantially vertical. Additional embodiments include an interconnect structure, further comprising an etchstop liner positioned over at least the sidewalls and a top surface of one or more of the second dielectric caps. Additional embodiments include an interconnect structure, wherein the first interconnect lines are spaced less than 30 nm from the second interconnect lines. Additional embodiments include an interconnect structure, wherein the first interconnect lines and the second interconnect lines are different materials.

Embodiments of the invention include a method of forming an interconnect structure comprising: forming one or more first trenches through a first hardmask layer and into an interlayer dielectric (ILD) formed below the first hardmask layer; disposing a first metal into the one or more first trenches to form first interconnect lines; forming a selective cap over each of the first interconnect lines; forming one or more second trenches into the ILD in an alternating pattern with the first trenches; disposing a second metal into the one or more second trenches to form second interconnect lines; disposing a DSA layer over the top surfaces of the selective caps and the second interconnect lines, wherein the DSA layer segregates into first polymer regions over the selective caps and second polymer regions over the second interconnect lines; removing the second polymer regions to expose the second interconnect lines; forming a second dielectric cap over the second interconnect lines; removing the first polymer regions to expose the selective caps; and forming a first dielectric cap over the selective caps. Additional embodiments include a method of forming an interconnect structure, wherein the DSA layer is a diblock copolymer. Additional embodiments include a method of forming an interconnect structure, wherein the diblock copolymer is polystyrene-b-polymethylmethacrylate (PS-b-PMMA), and wherein the first polymer region is PS and the second polymer region is PMMA. Additional embodiments include a method of forming an interconnect structure, wherein a polystyrene (PS) brush is grafted onto the selective caps prior to disposing the DSA layer over the top surfaces of the selective caps and the second interconnect lines. Additional embodiments include a method of forming an interconnect structure, wherein forming the first trenches comprises: forming a backbone layer above the first hardmask layer; forming spacers on the backbone layer, wherein a portion of the first hardmask layer remains exposed between the spacers; and etching through the exposed portions of the first hardmask layer and into the ILD underneath the exposed portions of the first hardmask layer. Additional embodiments include a method of forming an interconnect structure, wherein forming the second trench comprises: etching through the backbone layer; and etching through portions of the first hardmask layer and into the ILD.

Embodiments of the invention include a method of forming an interconnect structure, comprising: forming one or more first trenches through a first hardmask layer and into an interlayer dielectric (ILD) formed below the first hardmask layer; disposing a first metal into the one or more first trenches to form first interconnect lines; forming one or more second trenches into the ILD in an alternating pattern with the first trenches; disposing a sacrificial hardmask material into the one or more second trenches; forming a first dielectric cap over the first interconnect lines, wherein sidewalls of the first dielectric cap are not substantially vertical; removing the sacrificial hardmask material from the one or more second trenches; disposing a second metal into the one or more second trenches to form second interconnect lines; recessing the second interconnect lines so that a top surface of each of the one or more second interconnect lines is below a top surface of the first hardmask layer; and forming a second dielectric cap over the second interconnect lines, wherein at least a portion of the sidewalls of each of the one or more second dielectric caps are not substantially vertical. Additional embodiments include a method of forming an interconnect structure, wherein the sidewalls of the second dielectric caps are complementary to the sidewalls of the first dielectric caps. Additional embodiments include a method of forming an interconnect structure, wherein a first portion of the sidewalls of the second dielectric caps are substantially vertical and a second portion of the sidewalls of the second dielectric caps are not substantially vertical.

Embodiments of the invention include an interconnect structure comprising: an interlayer dielectric (ILD) with a first hardmask layer over a top surface of the ILD; one or more first interconnect lines in the ILD; a selective cap positioned over a top surface of each of the first interconnect lines, wherein the selective cap has a thickness that is less than a thickness of the first hardmask layer; a first dielectric cap positioned above each of the selective caps, wherein a surface of the first dielectric cap contacts a top surface of the first hardmask layer; one or more second interconnect lines in the ILD in an alternating pattern with the first interconnect lines; a second dielectric cap over a top surface of each of the second interconnect lines, wherein a surface of the second dielectric cap contacts a top surface of the first hardmask layer; and an etchstop liner positioned over at least sidewalls and a top surface of each of the second dielectric caps. Additional embodiments include an interconnect structure, wherein the first and second dielectric caps are a $SiO_xC_yN_z$ material, a $SiO_xC_Y$ material, a metal oxide material, or a metal nitride material, and wherein the etchstop liner is an aluminum-oxide or a hafnium-oxide material.

What is claimed is:
1. An interconnect structure comprising:
an interlayer dielectric (ILD) with a first hardmask layer over a top surface of the ILD;
first interconnect lines in the ILD;
a first dielectric cap positioned above each of the first interconnect lines, wherein a surface of the first dielectric cap contacts a top surface of the first hardmask layer;
second interconnect lines in the ILD arranged in an alternating pattern with the first interconnect lines; and
a second dielectric cap over a top surface of each of the second interconnect lines, wherein a surface of the second dielectric cap contacts a top surface of the first hardmask layer, and wherein the second dielectric caps are a different material than the first dielectric caps.

2. The interconnect structure of claim 1, further comprising a selective cap positioned over a top surface of each of the first interconnect lines.

3. The interconnect structure of claim 2, wherein the selective cap is a different material than the second interconnect lines.

4. The interconnect structure of claim 3, wherein the selective cap is tungsten (W), HfOx, or an alloy of tungsten and cobalt alloy.

5. The interconnect structure of claim 2, wherein the selective cap has a thickness that is less than a thickness of the first hardmask layer.

6. The interconnect structure of claim 5, wherein the thickness of the selective cap is less than 5 nm.

7. The interconnect structure of claim 2, wherein the sidewalls of the first and second dielectric caps are substantially vertical.

8. The interconnect structure of claim 2, wherein a centerline of each first dielectric cap is substantially aligned with a centerline of a first interconnect line.

9. The interconnect structure of claim 1, wherein the sidewalls of the first and second dielectric caps are not substantially vertical.

10. The interconnect structure of claim 9, wherein the sidewalls of the second dielectric caps are complementary to the sidewalls of the first dielectric caps.

11. The interconnect structure of claim 1, wherein a first portion of the sidewalls of the second dielectric caps are substantially vertical and a second portion of the sidewalls of the second dielectric caps are not substantially vertical.

12. The interconnect structure of claim 1, further comprising an etchstop liner positioned over at least sidewalls and a top surface of one or more of the second dielectric caps.

13. The interconnect structure of claim 1, wherein the first interconnect lines are spaced less than 30 nm from the second interconnect lines.

14. The interconnect structure of claim 1, wherein the first interconnect lines and the second interconnect lines are different materials.

15. A method of forming an interconnect structure comprising:
forming first trenches through a first hardmask layer and into an interlayer dielectric (ILD) formed below the first hardmask layer;
disposing a first metal into the first trenches to form first interconnect lines;
forming a selective cap over each of the first interconnect lines;
forming second trenches into the ILD in an alternating pattern with the first trenches;
disposing a second metal into the second trenches to form second interconnect lines;
disposing a DSA layer over the top surfaces of the selective caps and the second interconnect lines, wherein the DSA layer segregates into first polymer regions over the selective caps and second polymer regions over the second interconnect lines;
removing the second polymer regions to expose the second interconnect lines;
forming a second dielectric cap over the second interconnect lines;
removing the first polymer regions to expose the selective caps; and
forming a first dielectric cap over the selective caps.

16. The method of claim 15, wherein the DSA layer is a diblock copolymer.

17. The method of claim 16, wherein the diblock copolymer is polystyrene-b-polymethylmethacrylate (PS-b-PMMA), and wherein the first polymer region is PS and the second polymer region is PMMA.

18. The method of claim 16, wherein a polystyrene (PS) brush is grafted onto the selective caps prior to disposing the DSA layer over the top surfaces of the selective caps and the second interconnect lines.

19. The method of claim 15, wherein forming the first trenches comprises:
forming a backbone layer above the first hardmask layer;
forming spacers on the backbone layer, wherein a portion of the first hardmask layer remains exposed between the spacers; and
etching through the exposed portions of the first hardmask layer and into the ILD underneath the exposed portions of the first hardmask layer.

20. The method of claim 19, wherein forming the second trench comprises:
etching through the backbone layer; and etching through portions of the first hardmask layer and into the ILD.

21. A method of forming an interconnect structure comprising:
forming first trenches through a first hardmask layer and into an interlayer dielectric (ILD) formed below the first hardmask layer;
disposing a first metal into the first trenches to form first interconnect lines;
forming second trenches into the ILD in an alternating pattern with the first trenches;
disposing a sacrificial hardmask material into the second trenches;
forming a first dielectric cap over the first interconnect lines, wherein sidewalls of the first dielectric cap are not substantially vertical;
removing the sacrificial hardmask material from the second trenches;
disposing a second metal into second trenches to form second interconnect lines;
recessing the second interconnect lines so that a top surface of each of the second interconnect lines is below a top surface of the first hardmask layer; and
forming a second dielectric cap over the second interconnect lines, wherein at least a portion of the sidewalls of each of the second dielectric caps are not substantially vertical, and wherein the second dielectric caps are a different material than the first dielectric caps.

22. The method of claim 21, wherein the sidewalls of the second dielectric caps are complementary to the sidewalls of the first dielectric caps.

23. The interconnect structure of claim 21, wherein a first portion of the sidewalls of the second dielectric caps are substantially vertical and a second portion of the sidewalls of the second dielectric caps are not substantially vertical.

24. An interconnect structure comprising:
an interlayer dielectric (ILD) with a first hardmask layer over a top surface of the ILD;
first interconnect lines in the ILD;
a selective cap positioned over a top surface of each of the first interconnect lines, wherein the selective cap has a thickness that is less than a thickness of the first hardmask layer;
a first dielectric cap positioned above each of the selective caps, wherein a surface of the first dielectric cap contacts a top surface of the first hardmask layer;

second interconnect lines in the ILD in an alternating pattern with the first interconnect lines;

a second dielectric cap over a top surface of each of the second interconnect lines, wherein a surface of the second dielectric cap contacts a top surface of the first hardmask layer, wherein the second dielectric caps are a different material than the first dielectric caps; and an etchstop liner positioned over at least sidewalls and a top surface of each of the second dielectric caps.

25. The interconnect structure of claim 24, wherein the first and second dielectric caps are a $SiO_xC_yN_z$ material, a $SiO_xC_y$ material, a metal oxide material, or a metal nitride material, and wherein the etchstop liner is an aluminum-oxide or a hafnium-oxide material.

* * * * *